United States Patent [19]

Hood

[11] 4,159,064
[45] Jun. 26, 1979

[54] SEED PLANTER MONITOR

[75] Inventor: Charles F. Hood, Auburn, Ill.

[73] Assignee: Dickey-john Corporation, Auburn, Ill.

[21] Appl. No.: 821,580

[22] Filed: Aug. 3, 1977

[51] Int. Cl.² ............................................. A01C 7/18
[52] U.S. Cl. ....................................... 221/8; 111/1
[58] Field of Search .................. 221/3, 10, 6, 278, 13, 221/14, 21, 211, 8; 340/684; 111/1

[56] References Cited

U.S. PATENT DOCUMENTS 3,927,400  12/1975  Knepler .................................. 111/1

*Primary Examiner*—Stanley H. Tollberg
*Attorney, Agent, or Firm*—Trexler, Wolters, Bushnell & Fosse, Ltd.

[57] ABSTRACT

A monitor for use with a multiple row seed planter including a hopper for holding a supply of seeds, a plurality of conduits for carrying seeds to corresponding planting rows, a variable speed rotatable drum for receiving seeds from the hopper and delivering seeds to the conduits, a variable pressure air blower for supplying pressurized air to the hopper and drum to facilitate the seed delivery and a voltage supply source from a tractor or other vehicle pulling the planter. The monitor includes a plurality of sensors for providing a plurality of electrical signals corresponding to the above-mentioned planter functions. The monitor also includes an electronic circuit connected with selected sensors for receiving the electrical signals and for producing a display, as selected by an operator, of the values of the aforementioned functions including a count of the seeds passing through each of the conduits, the value of the air pressure applied to the drum, a rotation count of the drum, and the number of seeds passing through each conduit per drum revolution. The circuits also include circuits connected to selected sensors for producing an alarm signal in response to predetermined conditions of the functions associated therewith, including the level of seeds contained in the hopper, the value of the voltage supplied to the monitor, the rate of passage of seeds through the conduits, and the rotational speed of the drum.

33 Claims, 15 Drawing Figures

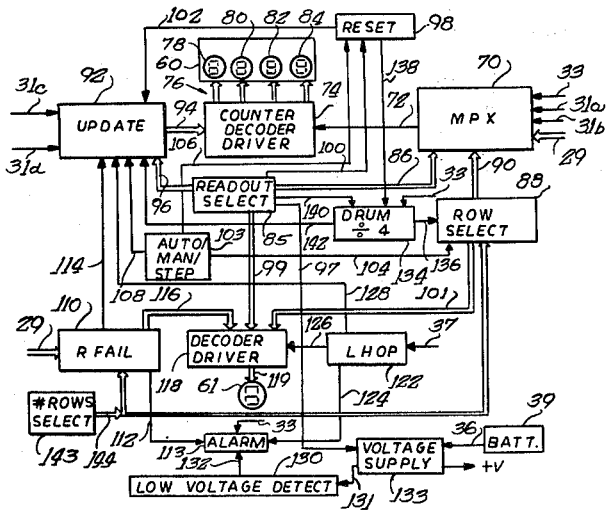

SEED PLANTER MONITOR

BACKGROUND OF THE INVENTION

This invention relates generally to a monitor for a plurality of functions and more particularly to a monitor for a plurality of functions associated with a seed planting machine of the type utilizing at least one rotating drum with pressurized air applied thereto for the delivery of seeds from a hopper through a plurality of conduits to individual planting rows to be simultaneously planted.

In many types of machines, apparatus and systems, it is necessary or desirable to monitor simultaneously a plurality of functions performed by the machine, apparatus or system to provide an indication of the proper functioning thereof to an operator. While the monitor according to the present invention may be used for monitoring a plurality of functions and is adaptable to a wide range of applications, the disclosure will be facilitated by addressing the problem of monitoring a plurality of functions associated with a seed planting machine.

Automatic seed planting machines have been developed to facilitate the planting of large fields of crops by a farmer with a minimum of time and manpower. Such seed planting apparatus are generally equipped with a plurality of seed dispensing nozzles so that a plurality of rows of seed can be planted in a single pass over a particular area of field. For example, 4, 6, 8 or more rows can be planted during a single planting operation. One such type of seed planting apparatus contemplated for use in conjunction with the present invention is one wherein a large hopper or hoppers containing a supply of seed to be planted is positioned for delivering the seeds to a rotating drum. To facilitate the delivery of the seed from the hopper to the drum and from the drum to a plurality of conduits connected with the seed dispensing nozzels, a power driven blower supplies air under pressure to the hopper and drum through a suitable connecting conduit or duct. The hopper and drum pressures are maintained substantially equalized. The drum includes a plurality of seed holding apertures or pockets arranged in rows and columns about the circumference and interior circular wall thereof, the number of apertures or pockets per row corresponding to the number of rows planted simultaneously by the planter. Near the top of the revolving drum, on an exterior surface thereof, a seed release wheel contacts each pocket and releases the seed held by the air pressure therein. As the seeds are released from the pocket they are caught by the air flow and carried through a discharge manifold positioned in registry with the pockets and release wheels, to respective delivery tubes or conduits where the seeds are delivered to the associated nozzles to be dispensed in their appropriate rows. A suitable drive is provided, to rotate the drum at a rate corresponding to the desired rate at which seeds are to be dispensed therefrom. This drive may, for example be actuated by a ground wheel or by a suitable variable speed motor.

It will be apparent from the foregoing, that the air pressure, rotational speed of the drum, and passage of seeds through the delivery tubes or nozzles must be monitored to insure proper operation of the seed planting machine. For example, different amounts of air pressure are required to be maintained in the drum for planting different types of seeds. Similarly, different rotational speeds of the drum must be maintained in order to dispense seeds therefrom at the desired rate. Further, it is desirable to monitor the individual seed dispensing nozzles to assure that seeds are being delivered to the ground therethrough and to monitor the level of the seed supply contained in the hopper to assure a sufficient supply of seed for maintaining the planting operation.

It is also desirable to provide means for providing an immediate indication to the operator should the monitor be accidently connected to a voltage supply other than that with which it is designed to operate. For example, a monitor designed to operate from a 12 volt tractor battery cannot function properly if connected to a six volt battery.

Monitoring systems and apparatus known in the prior art have heretofore included means for monitoring one or two of the above mentioned functions associated with an automatic planting machine. Thus, in order to monitor all of the above functions, a farmer would have to separately install several separate monitoring devices along with their associated readout, display or alarm devices at some convenient place on a tractor or other vehicle pulling the planting machine, to be observed during the planting operation. Thus, the farmer may find it difficult or impossible to simultaneously observe a plurality of different display devices, or even find space to mount them on his tractor to be continually observed. Further, a farmer would find it difficult to associate a given one of a plurality of display and alarm devices with the particular function being monitored thereby.

OBJECTS AND SUMMARY OF THE INVENTION

Accordingly, it is a general object of the present invention to provide a monitor for a plurality of functions for detecting the respective functions and providing a plurality of indications in accordance therewith.

A more specific object of the present invention is to provide a planter monitor for monitoring a plurality of functions associated with a seed planting machine and for providing indications corresponding to the values of the functions being monitored.

Another object of the present invention is to provide a planter monitor, in accordance with the foregoing object, further adapted to provide a display corresponding to the values of predetermined ones of the functions being monitored thereby and to provide an indication to the operator in response to malfunctions such as variations in predetermined ones of the functions being monitored thereby from desired values.

Yet another object of the present invention is to provide a planter monitor, in accordance with the foregoing objects, further adapted to provide a simple and easy to read display whereby an operator may readily ascertain the particular function which is either being displayed or for which a malfunction indication is being given.

Still another object of the present invention is to provide a planter monitor in accordance with the foregoing objects, which is further adapted to provide a display of a particular one of the functions being monitored as selected by the operator thereof, while continuing to monitor for malfunctions.

Briefly, and in accordance with foregoing objects, a seed planter monitor according to one form of the present invention comprises a plurality of sensor means for detecting the respective planter functions to be monitored and providing a plurality of electrical signals corresponding respectively thereto. Circuit means are provided including readout selector means for selecting predetermined ones of said sensor means to monitor the functions associated therewith. The circuit means also include readout circuit means connected to the readout selector means for receiving the electrical signals associated with the selected sensors and for providing readout signals corresponding to the values of the functions associated with the selected sensors in accordance with the electrical signals. The circuit means also includes indicator circuit means connected with predetermined ones of the sensors for receiving the electrical signals associated therewith and for providing an indication in response to a predetermined variation of the values of the selected electrical signals from predetermined values. Display means are provided connected with the readout circuit means for receiving the readout signals therefrom and producing a display in accordance therewith.

In a preferred embodiment, indicator means responsive to the indicator circuit means are provided, and included with the readout means in a console for providing a simplified and easy to read display of the functions being monitored. Also in a preferred embodiment, the display means include means connected with predetermined ones of the sensor means, with the selector means and with the indicator circuit means to identify the particular one of the sensors whose associated function value is being displayed or for which and indication of variation from a desired value is being given.

Other features, objects and advantages of the present invention will become apparent upon consideration of the following detailed description together with the accompanying drawings, wherein like reference numerals are used throughout to designate like elements and components.

BRIEF DESCRIPTION OF THE DRAWINGS

FIGS. 5 through 10 are schematic circuit diagrams of portions of the monitor circuits of FIGS. 3 and 4.

DETAILED DESCRIPTION OF THE PREFERRED EMBODIMENT

Figure 1:
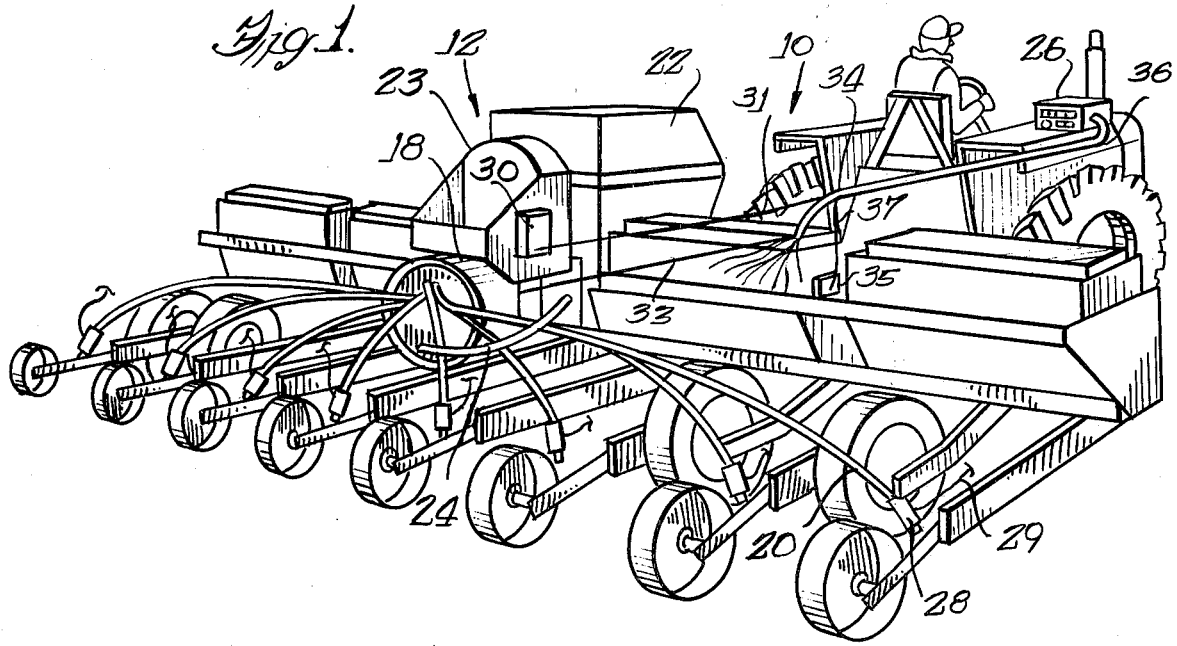
FIG. 1 is a perspective view of a seed planting machine being pulled by a tractor wherein the planter monitor of this invention is utilized.

Referring now to FIG. 1, a tractor 10 is shown pulling a seed planting machine 12, wherein a planter monitor of this invention is incorporated. The planter 12 includes one or more hoppers 22 for holding a supply of seed to be planted and a rotatable drum 18 to receive the seed from the hopper 22 and distribute it via a plurality of delivery tubes 20 to be dispensed to appropriate planting rows. The planter 12 also includes a housing 23 containing a suitable power driven blower for supplying air under pressure to the hopper 22 and drum 18, and a suitable drive for rotating the drum 18. The seeds and pressurized air are supplied to the drum 18 from the hopper 22 via a suitably connected duct or conduit 24.

The monitor of the present invention includes a display console 26, positioned on the tractor 10 in front of the operator, enabling the operator to maintain his vision on the direction of travel of the tractor 10 while still observing the display console 26. Also included are a plurality of sensors including seed sensors 28 connected to each of the seed delivery tubes 20 for providing an indication corresponding to the passage of seeds therethrough, an air pressure sensor 30 mounted adjacent the hopper 22 for providing a signal corresponding to the air pressure supplied to the drum 18 therefrom, a rotation sensor 32 (shown in FIG. 2) for providing a signal corresponding to each rotation of the drum 18, and a hopper level sensor 35 mounted in the hopper 16 for providing a signal in response to a predetermined level of the seed supply contained therein. The sensors 28, 30, 32 and 35 are provided with suitable connecting lines 29, 31, 33 and 37 respectively, preferably joined together to form a cable 34 running back to the console 26 to connect with monitor circuits included therein, to be described in detail below. The monitor 26 is also provided with a suitable connecting cable 36 to an appropriate voltage supply, such as the battery (not shown) of tractor 10. The remaining elements of the tractor 10 and planter 12 are of known construction and need not be described in detail herein.

Figure 2:
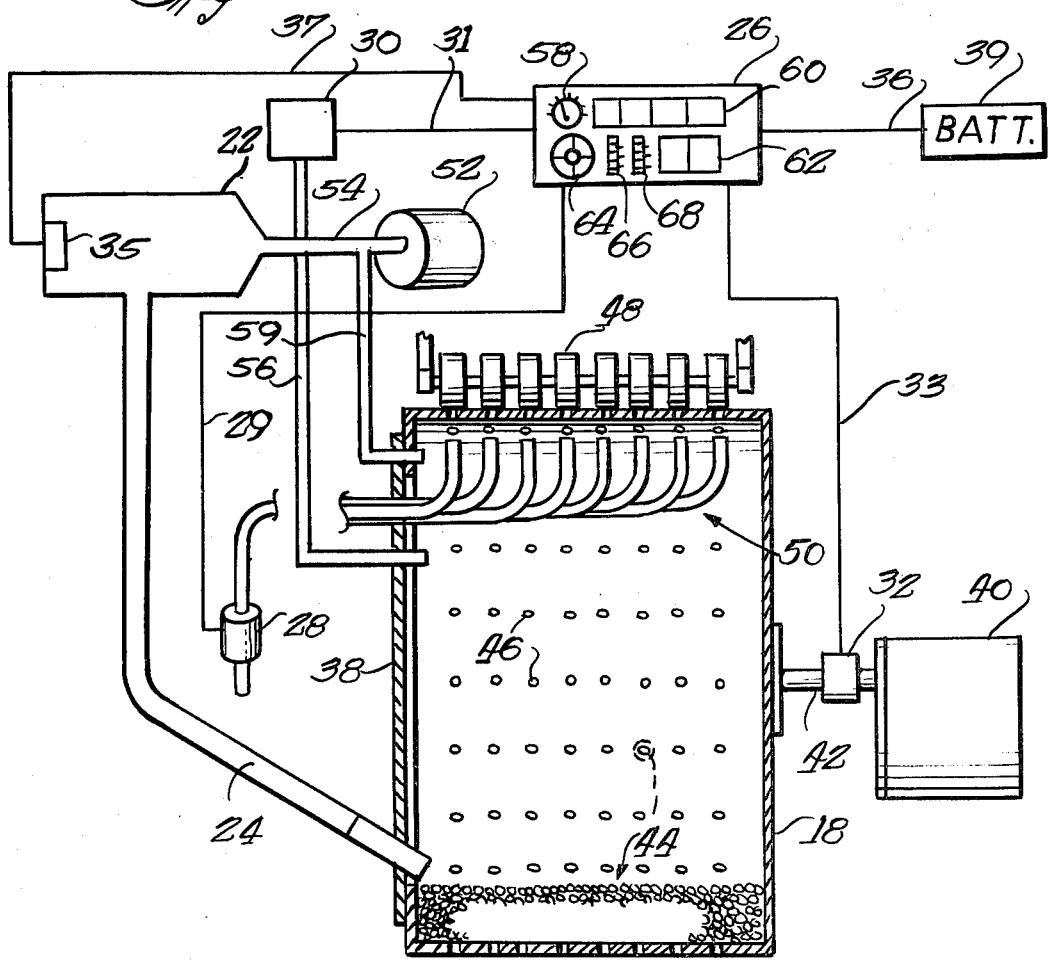
FIG. 2 is a cut-away view of a planting drum of the seed planter of FIG. 1 together with a diagrammatic representation of other components of the seed planter of FIG. 1 and of the monitor of this invention.

Referring now to FIG. 2, a partially cut-away view of the drum 18 illustrates additional details thereof, together with other parts of the planter 12 and parts of the monitor of the present invention associated therewith. To facilitate the illustration of the various elements and to show the cooperation therebetween, the relative proportions of parts have not been maintained in FIG. 2. In the particular embodiment shown for the purpose of illustrating the invention, the planter 12 and drum 18 are of the type adapted to plant 8 rows of seed simultaneously. It will be understood, however, that the planter monitor of the present invention may be associated with planters adapted to plant any desired number of rows of seed. Such planters may also include a pair of drums, such as the drum 18, each associated with a number of seed delivery tubes, such as the tubes 20.

The drum 18 includes an end wall 38 which remains stationary while the rest of the drum 18 is rotatable by a drive 40 connected to the drum by a shaft 42. The duct or conduit 24 enters the drum through the stationary end wall 38 and delivers seeds 44 thereto from the hopper 22. The drum 18 is provided with a plurality of holes 46 arranged in rows and columns around the inner circumference thereof, each column corresponding to one planting row. A plurality of rollers 48 are provided mounted in contact with the outer surface of the drum 18 near the top thereof, each roller 48 being in alignment with a corresponding column of holes 46. A manifold 50 comprising a number of tubes corresponding to the seed delivery tubes 20 is mounted inside the drum, and exists through the end wall 38 thereof, each tube being associated with a corresponding one of the rollers 48. In operation, as the holes 46 come in contact with the rollers 48 during the rotation of the drum 18, the seeds 44 held in the holes 46 are released by the rollers 48 and carried by the air flow through the tubes of the discharge manifold 50 to the seed delivery tubes 20 to be dispensed into their appropriate rows.

Air under pressure is provided to the hopper 16 and, via a duct or conduit 59 to the drum 18 by a blower 52 connected to the hopper 22 by a suitable air duct or conduit 54. Suitable means are provided (not shown) for the operator to adjust or vary both the amount of the air pressure supplied by the blower 52 and the speed of rotation of the drum, to suitable values for the types of seeds being planted and the rate at which it is desired to dispense seeds from the drum 18.

The air pressure sensor 30 is connected to the drum 18 by suitable conduit means 56 and to the monitor circuits contained in the console 26 by the line 31, for delivering suitable signals thereto, corresponding to the air pressure in the drum 18. A plurality of seed sensors 28, one of which is shown in FIG. 2, is provided with each sensor attached to a seed delivery tube 20 and via a line 29 to the monitor circuits of the console 26 for delivering a suitable signal thereto corresponding to the passage of seeds through the seed delivery tubes 20. The rotation sensor 32 is connected to the shaft 42 and by a line 33 to the monitoring circuits of the console 26 for delivering signals thereto in response to the rotation of the shaft 42 and drum 18 connected to rotate in unison therewith.

The console 26 includes selector means such as a selector switch 58 for selecting a sensor to display the function associated therewith, and a first display portion 60 for displaying the value of the function selected. The console 26 also includes a second display portion 62 for indentifying the seed delivery tube sensor being monitored, as will be described in further detail hereinbelow. The console 26 also includes suitable indicator means 64 for providing an indication when certain ones of the functions to be monitored vary from a predetermined desired value, as will be described in detail below. A three position control switch 66 and a three position control switch 68 are also provided on the console 26 for selecting, respectively, the number of rows that the particular planter with which the monitor is being used is adapted to simultaneously plant, and a manual or automatic mode of operation of the monitor, to be described further below.

The seed sensors 28 preferably comprise sensors of the type described in U.S. Pat. No. 3,974,377 to Steffen and assigned to the assignee of this application. The rotation sensor 32 preferably comprises a sensor of the type described in U.S. Pat. No. 3,739,367 to Fathauer and assigned to the assignee of this application. The hopper level sensor 35 preferably comprises a sensor of the type described in U.S. Pat. No. 4,100,538 to Knepler and assigned to the assignee of this application. The air pressure sensor 30 preferably comprises a sensor and associated electronic circuit as described in U.S. Pat. No. 4,112,777 to Knepler also assigned to the assignee of the present application.

Figure 3:
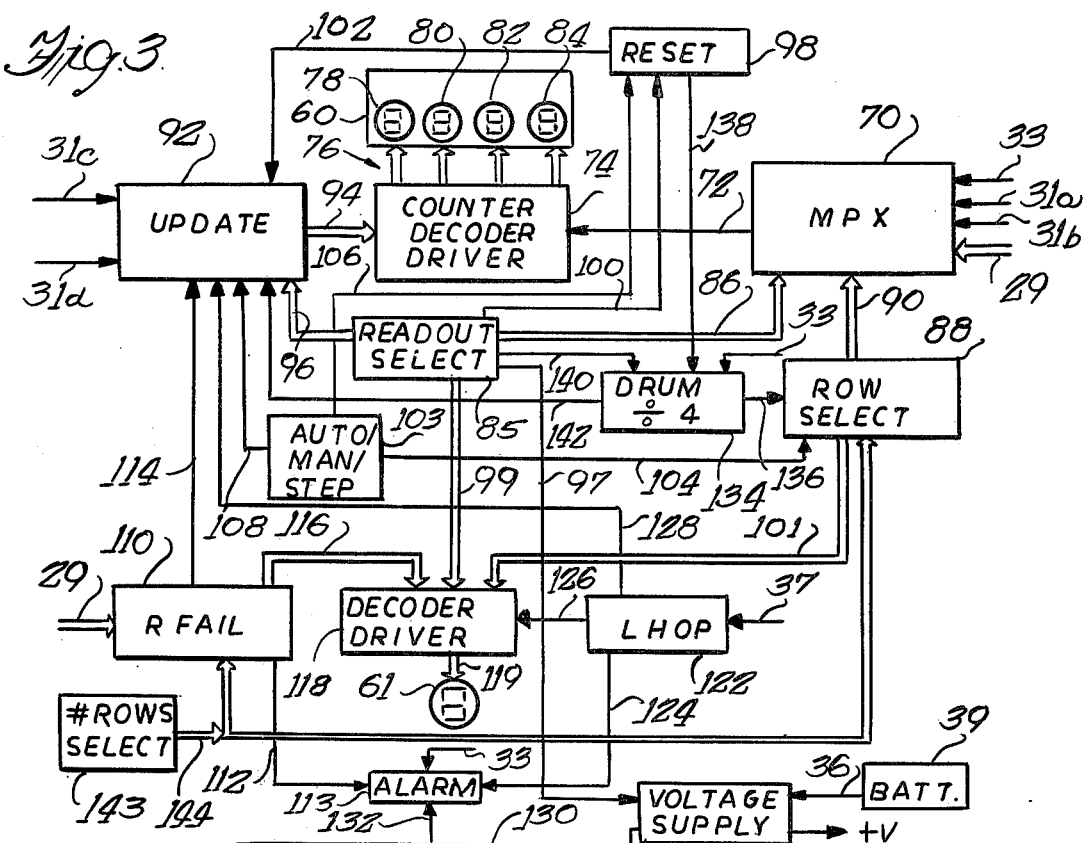
FIG. 3 is a block diagram of a monitor circuit associated with a first embodiment of a monitor of the present invention.

Referring now to FIG. 3, a first embodiment of a monitor circuit according to this invention is shown in block diagrammatic form. The embodiment of FIG. 3 is adapted for use with a planter of the type described above which is adapted to plant up to eight rows of seed simultaneously. It will be appreciated that while the planter 12 illustrated in FIG. 1 and FIG. 2 utilizes a single rotating drum 18, the monitor circuit of FIG. 3 is also adapted for use with a similar planter which utilizes a pair of rotating drums such as the drum 18, both driven from a common shaft at the same speed. In the latter case, two air pressure sensors such as sensor 30 of FIG. 2 would be utilized, one being associated with each of the respective drums, such as the drum 18.

The connecting lines 29 from the seed sensors 28, the line 33 from the rotation sensor 32 and two lines 31a and 31b from drum air pressure sensors 30 are connected as inputs to a multiplexer (MPX) 70. An output line 72 of the multiplexer 70 is connected to the input of a counter/decoder-driver (C/D) circuit 74, which is connected by connecting lines designated generally 76 to drive digital display elements 78, 80, 82 and 84 of the display portion 60. A readout selector circuit 85 including the readout selector means 58 of FIG. 2 is connected by connecting means 86 to the multiplexer 70 and row select circuit means 88 are connected by connecting means 90 to the multiplexer 70, for providing appropriate signals thereto for selecting individual ones of the sensors connected at the inputs 29, 31a, 31b and 33 thereof to present the pulses from the sensors associated therewith via the lines 72 to the counter/decoder-driver (C/D) 74. The C/D 74 counts the pulses presented by the multiplexer via the line 72 and decodes the count into a seven-segment format and provides appropriate driver signals for the seven-segment display element 78 through 84 of the display portion 60. It will be noted that each air pressure sensor 30 has two output signals associated therewith, the first one being connected via the lines 31a and 31b, respectively to the multiplexer 70, the second signals therefrom being connected via lines 31c and 31d respectively, to an update circuit 92 whose output is connected via connecting means 94 to an update input of the C/D circuit 74, to provide an appropriate control signal thereto for properly counting the pulses from the air pressure sensor or sensors associated with the planter. The circuits and apparatus associated with the air pressure sensor 30 for producing appropriate signals to the multiplexer 70 and to the counter/decoder-driver 74 are described in detail in the copending application of the Knepler, Ser. No. 808,807, which is incorporated by reference herein. The readout selector circuit means 85 is also connected via a line 96 to the update circuit means 92 to cause the above described signals on the lines 31c and 31d to be utilized as a control for the C/D 74, as described above, simultaneously with the selection of the corresponding air pressure sensor signals on the lines 31a or 31b by the multiplexer 70.

A reset circuit 98 has one input connected to a line 100 from the readout selector circuit 85 and an output connected by a line 102 to the update circuit 92, for providing an update control signal via connecting means 94 to the counter/decoder-driver 74 to reset the display elements 78 through 84 of the display portion 60 to zero whenever a new sensor is selected by the readout selector means 58. An auto/manual/step (A/M/S) circuit 103, including the switch 68 of FIG. 2 is connected via a line 104 to the row select circuit 88, via a line 106 to the reset circuit 98 and via a line 108 to the update circuit 92. The A/M/S circuit 103, in response to the switch 68, is adapted to select either a scan mode, in which the row select circuit 88, together with the MPX 70 automatically selects individual ones of the seed sensor inputs on the lines 29, in a predetermined sequence, or a hold mode wherein individual ones of the seed sensors are selected by the row select circuit 88 and multiplexer 70 under the manual control of the switch 68 associated with the A/M/S circuit 103, and held until a subsequent actuation of the switch 68. The A/M/S circuit 103 also provides appropriate signals to the reset circuit 98 and update circuit 92 to reset the display elements 78 through 84 of the display portion 60 for each new seed sensor selected.

The lines 29 from the seed sensors 28 are also connected to the inputs of a row failure (RFAIL) detector circuit 110, which has an output connected by a line 112 to an alarm circuit 113 including the alarm means 64 for actuating the alarm means 64 in response to a failure of any of the seed delivery tubes 20 to pass seeds therethrough, as detected by the seed sensors 28. The RFAIL circuit 110 has an output connected by a line 114 to the update circuit 92 to cause blanking of the display portion 60 in response to a seed delivery tube failure as detected thereby. The RFAIL circuit 110 also has an output connected by connecting means 116 to a decoder/driver circuit 118 to provide appropriate signals thereto for driving the display portion 61 connected thereto by connecting means 119, to provide an indication identifying the particular seed delivery tube 20 at which a failure is detected. Connecting means 99 and 101, respectively, are provided between the readout and row select circuits 85 and 88 and the decoder/driver 118 to provide for selection thereof simultaneously with selection of the seed sensor inputs 29 to the MPX 70, for identification of the individual inputs 29 as multiplexed to the C/D 74 for readout.

A low hopper (L HOP) circuit 122 has an input connected to the line 37 to receive signals form the hopper level sensor 35, and an output connected by a line 124 to the alarm circuit 113 for actuating the alarm means 64 in response to the level of seeds in the hopper falling below a predetermined desired level. The L HOP circuit 122 also has outputs connected via the lines 126 and 128 to the decoder/driver 118 and update circuit 92, respectively, for blanking the display portions 60 and 61 in response to a low hopper seed level indication. Thus, the low hopper alarm indication is assigned priority over the row failure alarm indication. A low voltage detector circuit 130 is connected via a line 131 to a voltage supply 133 which is connected by the line 36 to a power source such as the tractor battery 39. The low voltage detector circuit 130 is connected by a line 132 to the alarm circuit 113 for actuating the alarm means 64 in response to detection of an improper voltage supply due to a connection being made at the line 36 to an unsuitable battery. The line 33 from the drum rotation sensor 32 is also connected to the alarm means 64 for disabling the alarm means 64 in response to the rotational speed of the drum falling below a predetermined desired speed.

A drum divide-by-four circuit (DRUM÷4) 134 has an input connected to the line 33 from the drum rotation sensor 32, and an output line 136 connected to the row select circuit 88. Other connections to the drum divide-by-four circuit 134 include a line 138 from the reset circuit 98, a line 140 from the readout select circuit means 85, and a line 142 connected with the update circuit 92. The readout select circuit means 85 is adapted to select the drum divide-by-four circuit 134 together with individual ones of the seed sensors input lines 29 for providing a signal to the counter/decoder driver 74 via the multiplexer 70 corresponding to the number of seeds dispensed through the selected seed delivery tube 20 per revolution of the drum 18, averaged over four revolutions thereof.

A number of rows select circuit (No. ROWS SELECT) 143, including the switch 66, is connected by a line 144 to the RFAIL circuit 110 and the row select circuit 88 for providing an appropriate signal thereto corresponding to the number of rows which the particular seed planter with which the monitor is being used is adapted to plant simultaneously.

Figure 4:
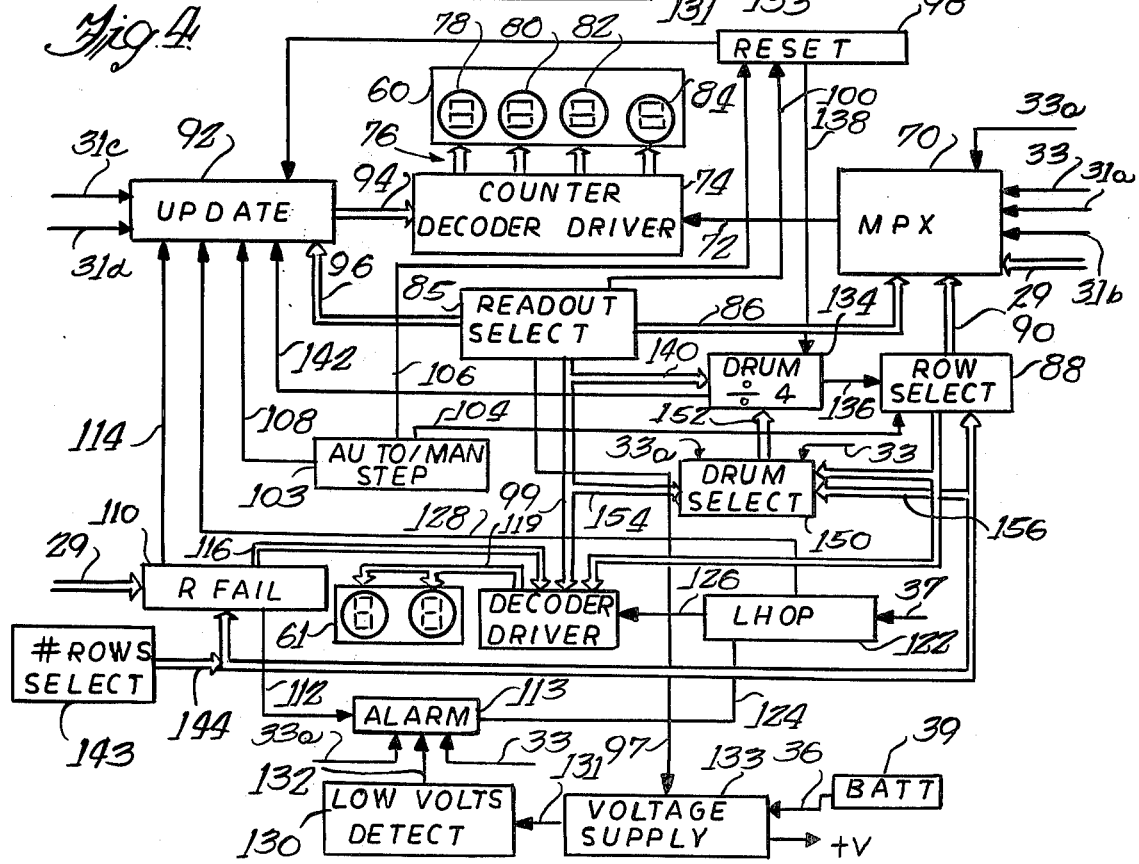
FIG. 4 is a block diagram of a monitor circuit associated with a second embodiment of a monitor of the present invention.

Referring to FIG. 4, a second embodiment of a monitor circuit according to this invention is shown in block diagrammatic form. The embodiment of FIG. 4 is specifically adapted for use with a planter of the type described above which is adapted to plant up to 16 rows of seed simultaneously. It will be appreciated that while the planter 12 utilizes a single rotating drum 18, the monitor circuit of FIG. 4 is adapted for use with a similar planter which utilizes a pair of rotating drums such as the drum 18, each being driven from its own associated drive such as the drive 40 via a suitable shaft such as the shaft 42, as illustrated in FIG. 2. It will be appreciated then, that in this embodiment, a pair of substantially identical rotation sensors such as the sensor 32 of FIG. 2 are provided, as well as a pair of substantially identical air pressure sensors such as the sensor 30 of FIG. 2, one air pressure sensor and one rotational speed sensor, respectively, being connected as shown in FIG. 2 for each rotatable drum.

The block diagram of FIG. 4 includes substantially identical circuit elements as those illustrated and described above in reference to FIG. 3, with certain differences therebetween, to accomodate the additional rotational speed sensor and the additional seed delivery tube sensors. These differences will be described in further detail hereinbelow with reference to FIGS. 5 through 15. Therefore, like reference numerals are used to designate the like circuit elements and interconnections therebetween of FIG. 4.

The elements of the block diagram of FIG. 4 which represent additional elements to those shown and described above with reference to FIG. 3 include the following. An additional connecting line 33a is provided from the second drum rotation sensor associated with the second drum of the two drum planter described above. The line 33a is provided with suitable connections to the multiplexer (MPX) 70 and the alarm means 64. A drum select circuit 150 is provided including suitable connections to the lines 33 and 33a from the two drum rotation sensors associated with the two drums of the planter. The drum select circuit also includes connecting means 152 to the drum divide-by-four circuit 134, connecting means 154 from the readout select circuit 85 and connecting means 156 from the row select circuit 88. Also, the display portion 61 includes two seven-segment digital display elements, rather than the single element described in FIG. 3, to accomodate the additional number of seed sensors.

Figure 5:
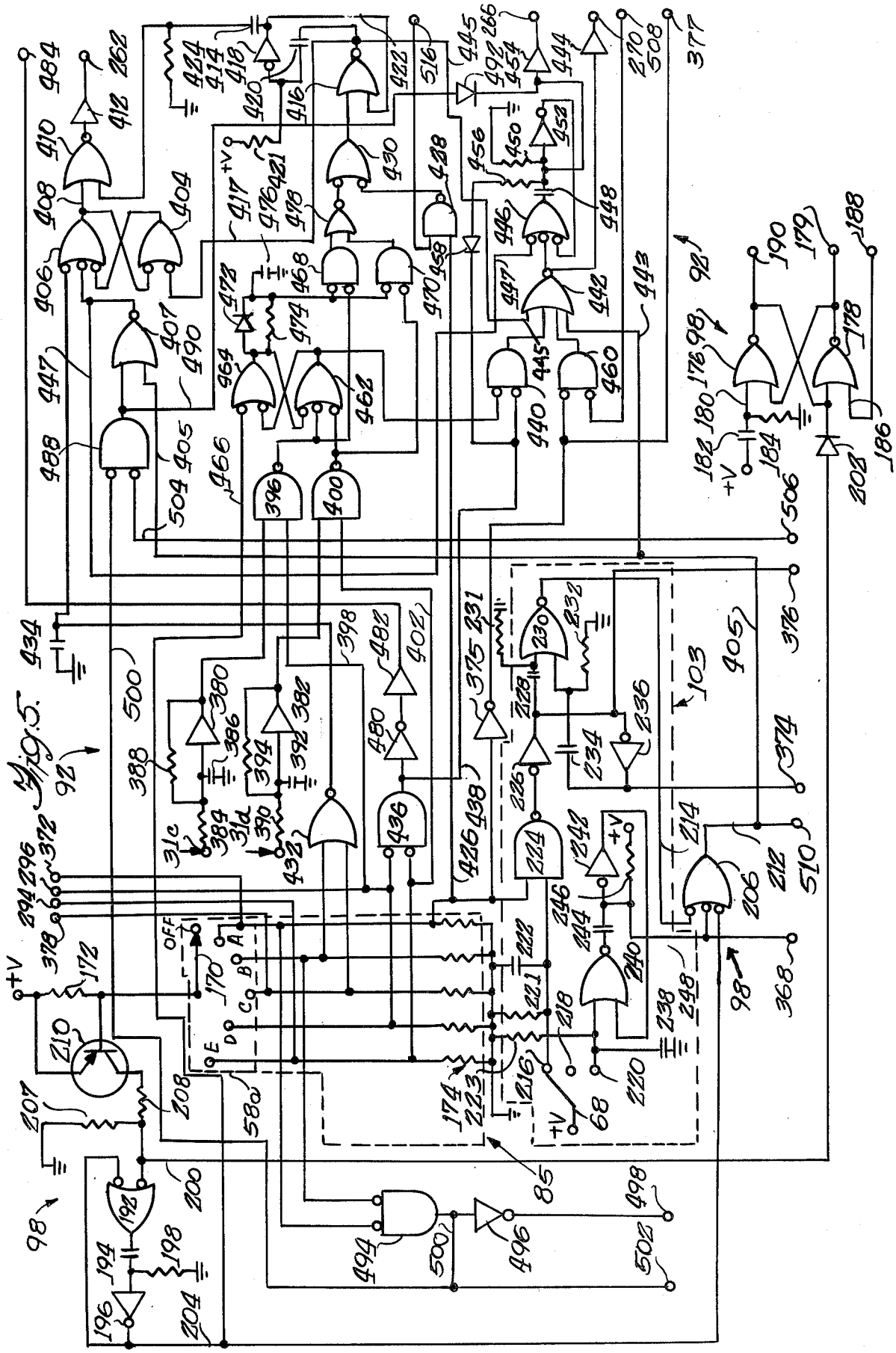

Referring now to FIG. 5, the readout selector switch 58 preferably comprises a single wafer rotatory switch one side thereof being illustrated in FIG. 5 as a single-pole non-shorting switch 58a that determines what information will be presented to the counter/decoder-driver 74 to be displayed on the display portion 60. The switch portion 58a includes a rotary contactor 170 connected via a resistor 172 to a positive voltage supply. The contactor 170 is selectively actuatable to one of six terminals as follows: first terminal labeled OFF, which open circuits the contactor 170, corresponding to the monitor being off, and terminals labeled A, B, C, D, and E, each connected by a resistor, designated generally 174, to ground. Thus, an appropriate signal, corresponding to a logic "1" is presented at each of the terminals A through E by the actuation of the movable contactor 170 into contact therewith. This then provides suitable logic signals for selecting the sensors whose functions are to be displayed and for updating the display, as new sensors are selected thereby, as will be described in more detail hereinbelow.

The reset circuit 98 includes a flip-flop comprising a pair of two input NOR gates 176 and 178. An output terminal 179 of the flip-flop is connected at the output of the gate 178 thereof. An input 180 of the flip-flop, at one input of the gate 176, is connected via a capacitor 182 to a positive voltage supply and via a resistor 184 to ground. Thus, the flip-flop is set when power is switched on in the unit and serves as a power-up reset. The opposite input of the flip-flop 186, at the input of the gate 178, is connected to a terminal 188 to the row failure (RFAIL) circuit 110 for resetting the flip-flop. A set results in the output terminal 190 of the flip-flop going to logic "0". The reset circuit 98 also includes a one shot comprising a two input NAND gate 192 connected via a capacitor 194 to an input of an inverter 196, whose output is connected back to one input of the NAND gate 192, and a resistor 198 connected between the input of the inverter 196 and ground. The opposite input of the NAND gate 192 is connected via a line 200 to the anode of a diode 202 whose cathode is connected with the output 190 of the flip-flop including the gates 176 and 178. Thus, a logic "0" at terminal 190 results in a logic "0" on the line 200 via the diode 202 which generates a pulse on a output line 204 of the one shot including the gate 192 and inverter 196. The line 204 is connected to one input of a three input NAND gate 206 which is also a part of the reset circuit 98. The input of the NAND gate 192 connected to the line 200 is also connected via a resistor 207 to ground and via a resistor 208 to the collector electrode of a transistor 210, whose emitter electrode is connected to a positive voltage supply and whose base electrode is connected to the junction of the resistor 172 with the actuator member 170 of the selector switch 58a. Thus, when the actuator 170 is moved between contacts of the switch 58a, there is a momentary open circuit at the base of the transistor 210 which also actuates the one shot including the gate 192 and inverter 196 to produce a pulse on the line 204. The pulse at the line 204 causes a corresponding reset pulse on a line 212, connected to the output of the NAND gate 206. Another input of the NAND gate 206 is connected to a line 214 from the auto/manual/step circuit 103, for producing a reset pulse on line 212 in response thereto.

The auto/manual/step circuit includes the switch 68, which comprises a three position switch actuatable between a terminal 216 and a terminal 218, corresponding to automatic and manual positions, respectively. The switch 68 is also momentarily actuatable between the terminal 218 and a terminal 220 which corresponds to a step position. The terminal 215 is connected to ground via the parallel combination of a resistor 221 and a capacitor 222, and to one input of a two input NAND gate 224, whose output is connected via an inverter 226 in series with a capacitor 228 to one input of a two input NOR gate 230 and a resistor 231 to ground. The output of the two input NOR gate 230 is connected to the line 214. The opposite input of the NOR gate 230 is connected via a resistor 232 to ground and via a capacitor 234 to the output of an inverter 236 whose input is connected to the output of the inverter 226. The terminal 218 is open circuited. The terminal 220 is connected to ground via a parallel combination of capacitor 238 and a resistor 223, and to one input of a two input NOR gate 240, which together with an inverter 242 forms a one shot. The output of the NOR gate 240 is connected via a capacitor 244 to the input of the inverter 242 whose output is connected to the opposite input of the NOR gate 240. The input of the inverter 242 is also connected via a resistor 246 to a positive voltage supply and via a line 248 to the third input of the three input NAND gate 206. Thus, when the switch 68 is actuated from the terminal 216 to the terminal 218 or vice versa or when it is momentarily actuated to the terminal 220, a reset pulse is generated at the line 212 by the NAND gate 206 in response to the signals produced by the actuation of the switch 68 on the lines 214 and 248, respectively.

Figure 6:
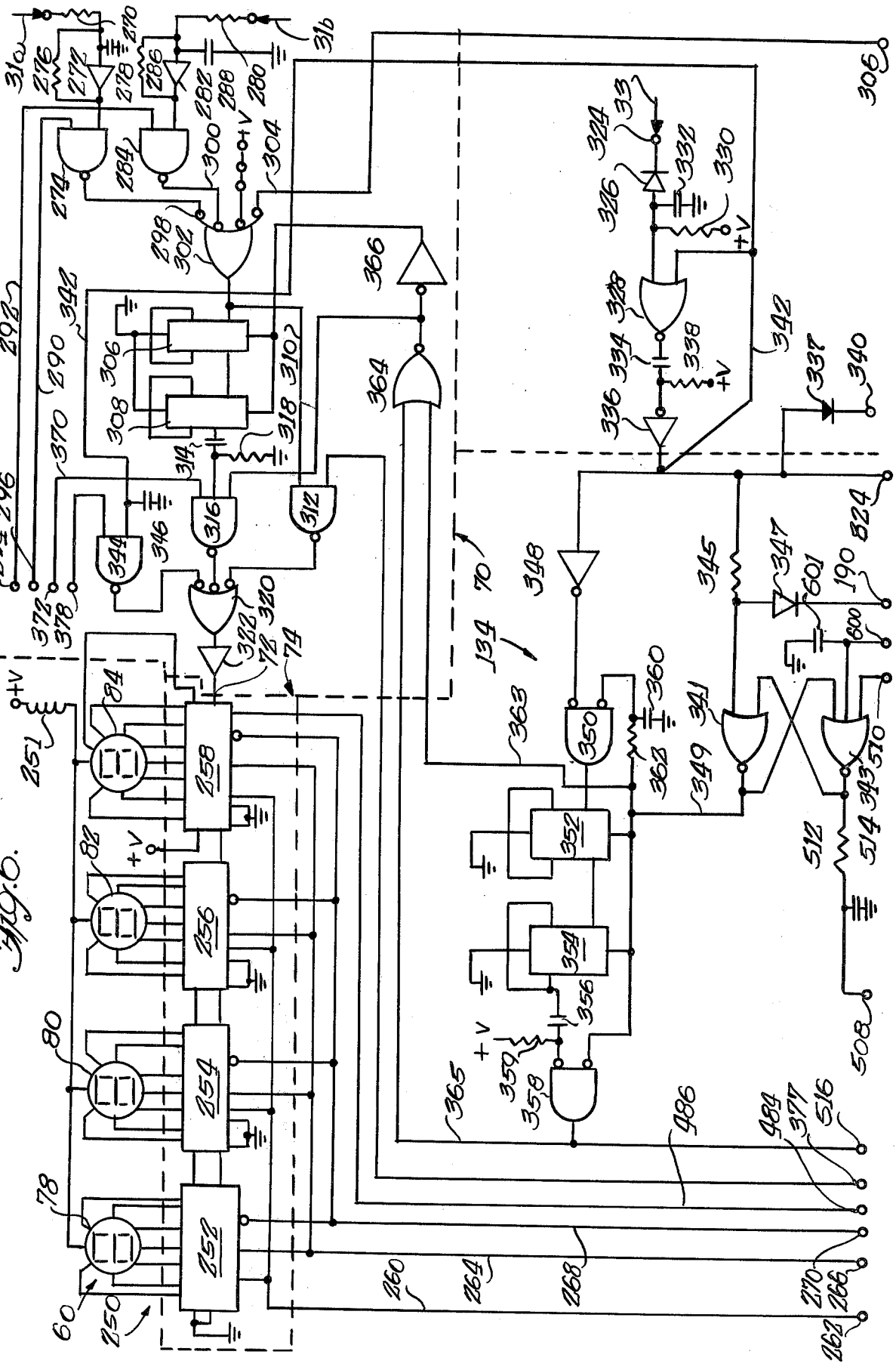

Referring now to FIG. 6, the display portion 60 comprises a four digit diplay including seven-segment digital display elements 78, 80, 82 and 84. Each of the display elements is provided with suitable connections via a coil 251 to a positive voltage supply and with connections, designated generally 250, to a corresponding one of four four-bit counter/latch seven-segment drivers, 252, 254, 256 and 258, which are connected to form the four decade counter/decoder-driver (C/D) 74. Each of the counter/latch-driver circuits 252, 254, 256 and 258 include a strobe input, a blanking input and a reset input. A line 260 connects the strobe inputs in common to a terminal 262, a line 264 connects the blanking inputs in common to a terminal 266 and a line 268 connects the reset inputs in common to a terminal 270. The terminals 262, 266 and 270 are connected to the updating circuit 92 for receiving appropriate strobe, blanking and reset signals to the C/D 74, as will be described in detail hereinbelow. The C/D 74 is connected by the line 72 to the multiplexer circuit 70 which provides appropriate logic for selecting individual predetermined ones of the sensors as sources of pulses to be counted at the clock input of the C/D 74, attached to the line 72.

Two identical input circuits are provided to accomodate two air pressure sensors which are connected by the lines 31a and 31b to inputs thereof as seen in the upper right hand portion of FIG. 6. A first air pressure input circuit connected to the line 31a comprises a Schmitt trigger including resistor 270 connected in series from the line 31a to the input of a buffer 272 whose output is connected to one input of a two input NAND gate 274. A feedback resistor 276 is connected between the input and output of the buffer 272 and a capacitor 278 is connected between the input of the buffer 272 and ground. Similarly, a resistor 280 is connected in series between the line 31b and the input of a Schmitt trigger including a buffer 282 whose output is connected to one input of a two input NAND gate 284, a feedback resistor 286 is connected between the output and input of the buffer 282 and a capacitor 288 is connected between the input of the buffer 282 and ground. The NAND gates 274 and 284 have their opposite inputs connected via lines 290 and 292 respectively, to terminaals 294 and 296, which are connected to the terminals D and E of the readout selector switch 58a as seen in FIG. 5, to receive a logic "1" signal therefrom when the selector or actuator member 170 is moved into contact with the respective terminals D or E, for enabling the respective gates 274 and 284 to pass the respective air pressure signals therethrough.

The outputs of the gates 274 and 284 are connected to a pair of inputs 298 and 300, respectively of a four input NAND gate 302. A third input of the gate 302 is connected to a positive voltage supply, and a fourth input thereof is connected via a line 304 to a terminal 306 for receiving seed sensor signals from one of the seed sensors as selected by the row select circuit 88 and associated circuits to be described hereinbelow. The output of the NAND gate 302 is connected to an input of a divide-by-four counter comprising a pair of D flip-flops 306 and 308, and via a line 310 to one input of a two input NAND gate 312. The output of the divide-by-four counter comprising the D flip-flop 306 and 308 is connected via a capacitor 314 to one input of a three input NAND gate 316, which input is also connected via a resistor 318 to ground. The respective outputs of the NAND gates 312 and 316 are connected to two inputs of a three input NAND gate 320 whose output is connected via a buffer 322 to the line 72 which is connected to the count input of the C/D 74.

The drum revolution sensor is connected via the line 33 to an input terminal 324 in the lower right-hand portion of FIG. 6, which is connected to the cathode of a diode 326 whose anode is connected to one input of a two input NOR gate 328, which input is also connected via a resistor 330 to a positive voltage supply and via a capacitor 332 to ground. The output of the NOR gate 328 is connected via a capacitor 334 to an input of an inverter 336, which input is also connected via a resistor 338 to a positive voltage supply. The output of the inverter 336 is connected to the anode of a diode 337, whose cathode is connected to a terminal 340, and via a line 342 to the opposite input of the NOR gate 328 to form a one-shot and to one input of a two input NAND gate 344, which input is also connected via a capacitor 346 to ground. The output of the gate 344 is connected to the third input of the three input NAND gate 320. The output of the inverter 336 is also connected to an input of an inverter 348 whose output is connected to one input of a two input NOR gate 350 whose output is connected to a divide-by-four counter comprising a pair of D flip-flops 352 and 354. The output of the counter is connected via a capacitor 356 to one input of a two input NOR gate 358 which input is also connected via a resistor 359 to a positive voltage supply. The opposite input of the NOR gate 350 is connected via a capacitor 360 to ground, via a resistor 362 to the the opposite input of the NOR gate 358, to the SET inputs of the D flip-flops 352 and 354 and by a line 363 to one input of a two input NOR gate 364. The output of the NOR gate 358 is connected by a line 365 to the opposite input of the NOR gate 364. The output of the NOR gate 364 is connected to a second input of a three input NAND gate 316 and to the input of an inverter 366 whose output is connected to the SET inputs of the flip-flops 306 and 308.

Referring now to FIGS. 5 and 6, when the actuator 170 of the switch 58a is actuated to contact terminal A, and the auto/manual/step switch 68 is actuated to the manual position at terminal 218, the number of seeds delivered per drum revolution ("seeds per revolution"), averaged over four drum revolutions will be displayed on the display portion 60 as follows. When the auto/manual/step switch 68 is actuated between the terminal 218 and the terminal 220, the one-shot including the NOR gate 240 and inverter 242 produces an output signal on the line 248 thereof which is connected to a terminal 368 to provide an appropriate signal to the row select circuit 88, to be described in detail hereinbelow, to select one of the seed sensors to be connected to the terminal 306 of FIG. 6 which provides one input at line 304 of the four input NAND gate 302. The passage of each seed through the seed delivery conduit associated with the seed sensor thus selected, produces a logic "0" signal at the input line 304 of the NAND gate 302. Since the desired display is the number of seeds dispensed per drum revolution averaged over four drum revolutions, the seed pulses must also be divided by four, thus, the output of the NAND gate 302 is connected with the D flip-flops 306 and 308 connected as a divide-by-four circuit. The output of the divide-by-four circuit is connected via the capacitor 314 to one input of the three input NAND gate 316, a second of whose inputs is connected via a line 370 to a terminal 372 which is connected to the terminal A, to receive an enabling signal for the gate 316. The divide-by-four counter comprising the flip-flops 306 and 308 is started at zero at the beginning of a four drum-revolution cycle, in response to the corresponding signal provided by the inverter 366 to the SET input thereof, the appropriate logic signal being provided via the NOR gate 364 whose inputs are connected to the drum divide-by-four circuit 134, as described above.

A two input NOR gate 341 and a three input NOR gate 343 in FIG. 6 are connected to form a flip-flop, having an input at the NOR gate 341 connected via a resistor 345 to the terminal 340 and to the anode of a diode 347 whose cathode is connected to the terminal 190 of the flip-flop including gates 176 and 178 of FIG. 5. An output of the flip-flop comprising the gates 341 and 343 is connected via a line 349 to the junction of the resistor 362 with the line 363 to one input of the two input NOR gate 364.

When the output on the line 349 of the flip-flop comprising the gates 341 and 343 is at logic "1", the output of the gate 364 is a logic "0" and the output of the inverter 366 is a logic "1". Thus, the NAND gate 316 is momentarily disabled to prevent the signal introduced at the output of the flip-flop 308 from being passed therethrough when the set input thereof is pulsed by the signal from the inverter 366, as described above. When the divide-by-four circuit comprising the D flip-flops 306 and 308 go to logic "0", the capacitor 314 and resistor 318 act as a differentiator to generate a pulse for every four seed pulses, as described above. With the selector switch 58a of FIG. 5 actuated to terminal A, a logic "1" will be present on the line 370 and at the input of an inverter 375 connected to the terminal A, whose output at a terminal 377 is connected to a control input of the gate 312 in FIG. 6. Therefore, the seed pulse divided by four will be transmitted through the gate 316 to the gate 320. The gates 312 and 344 are not enabled with the switch 58a of FIG. 5 in its A position, therefore the seed pulses occurring during four drum revolutions divided by four will be passed through the gate 320 and the buffer 322 to the line 72 connected to the count input of the C/D 74 and counted thereby and the count displayed on the display portion 60.

When the auto/manual switch 68 of FIG. 5 is actuated into contact with the automatic terminal 216, appropriate control signals are generated by the logic elements of the auto/manual circuit 103, described above, at output terminals 374 and 376, thereof which are connected to the output and input, respectively of the inverter 236, and to the like numbered terminals of the row select circuit 88 and multiplexer circuit 70 of FIG. 7, to be described below, for causing the seed sensors to be automatically selected in a predetermined sequence thereby. The seed sensors thus selected pass their associated seed signals via the terminal 306 to the circuit of FIG. 6 to be converted thereby to a seeds per revolution averaged over four drum revolutions display, in the same fashion as described above. In this automatic mode, the C/D 74 is adapted to display the count for one seed sensor while collecting the count for the next. For example, if the seed sensor associated with planting row number one is currently having its seed count per revolution displayed, the counter portion of the C/D 74 will be accumulating the seeds per revolution count for the seed sensor associated with row number 2.

Referring again to FIG. 5, when the actuator 170 of the switch 58a is actuated to terminal B thereof, a seed count is displayed on the display portion 60 for each seed sensor, as selected by the row selector circuit 88 and the portion of the multiplexer circuit 70 to be described below with reference to FIG. 7. The remainder of the circuitry of FIG. 6 functions equivalently to its mode of operation described above for the seeds per revolution count with the following exceptions. When the selector switch 58 is actuated to terminal B for the seed sensor count, the seed pulses are not divided by four by the divide-by-four circuit comprising the D flip-flops 306 and 308. Rather, the control input terminal 377 connected to the gate 312 is held at logic "1", since the actuator 170 is no longer in contact with terminal A, to provide the opposite logic state via the inverter 375 of FIG. 5. Therefore, the gate 312 is enabled, allowing the seed pulses at the output of the gate 302 to pass directly therethrough to be counted by the C/D 74.

When the actuator 170 of the switch 58a is actuated to contact the terminal C thereof, a logic "1" signal is provided at the terminal 378 connected to the terminal C and connected to the like numbered terminal at the input of the NAND gate 344 of FIG. 6. Thus, the drum revolution pulses from the line 342 connected to the opposite input thereof are passed therethrough to the gate 320, and therethrough to the buffer 322 and C/D 74 to be counted and displayed on the display portion 60.

It will be appreciated, that the descriptions herein of the logic signals resulting from the various circuits in response to actuation of the actuator 170 of the switch 58a into contact with the various individual terminals A through E thereof, are to be taken separately. That is, the logic signals resulting from an actuation into contact with terminal A, corresponding to the seeds per revolution count, do not apply for actuation of the switch to contact with any one of the terminals B through E. Each switch position results in only the logic signals associated with contacting that particular terminal.

When the actuator 170 of the switch 58a of FIG. 5 is moved into contact with terminal D thereof, appropriate logic signals are activated thereby to cause the C/D 74 and associated display portion 60 to display the drum air pressure or, in the case of a two drum planter, to display a drum air pressure at the first of the two drums. The terminals 294 and 296 connected with the terminals D and E respectively as seen in FIG. 5, also are connected with the gates 274 and 284 via the lines 292 and 290 of FIG. 6, to enable the respective drum pressure signals from the Schmitt triggers including the buffers 272 and 282. Thus, the respective drum air pressure signal at the input 298 or 300 of the gate 302 will be passed through the gate 302 and via the line 310 to the gate 312, which is enabled via the terminal 377, connected to the opposite input thereof by the logic signal received from the corresponding terminal 377 and the inverter 375 of the FIG. 5, when the switch 58 is in any position other than the A position. Since the gates 344 and 316 are not enabled with the switch in the D or E position, the respective drum air pressure signal at the input of the gate 320 from the output of the gate 312 will be passed therethrough and through the buffer 322 to the line 72 at the count input of the C/D 74 to be displayed on the associated display portion 60. As described above, and in the copending application of Knepler, Ser. No. 808,807, incorporated herein by reference, the drum air pressure sensor includes associated electronic circuits for providing two signals. A first signal comprises a pulse signal proportional in frequency to the air pressure applied at the sensor, which signal is applied via the lines 31a and 31b to the circuit of FIG. 6. A second signal comprises a gate or strobe signal, applied via the lines 31c and 31d to the circuit of FIG. 5. The strobe or gate signal is utilized to enable the C/D 74 for a suitable period, whereby the pulses from the inputs 31a or 31b counted thereby during the gate or strobe period correspond in predetermined, fixed units, as for example tenths of an ounce per square inch, to the air pressure applied to the sensor. The lines 31c and 31d are connected to a pair of Schmitt triggers comprising buffers 380 and 382, respectively. The line 31c is connected to one end of a resistor 384 whose opposite end is connected to the input of the buffer 380 and via a capacitor 386 to ground. A feedback resistor 388 is provided between the output and the input of the buffer 380. Similarly, the line 31d is connected to one end of a resistor 390 whose opposite end is connected to the input of the buffer 382 and via a capacitor 392 to ground. A feedback resistor 394 is provided between the input and the output of the buffer 382. The output of the buffer 380 is connected to one input of a two input NAND gate 396, whose opposite input is connected by a line 398 to the terminal D of the switch 58a. Similarly, the output of the buffer 382 is connected to one input of a two input NAND gate 400 whose opposite input is connected via a line 402 to the terminal E of the switch portion 58a. Thus, the gate or strobe signals are enabled or disabled at the respective gates 396 and 400 simultaneously with the respective air pressure signals at the gates 274 and 284 of FIG. 6. The outputs of the gates 396 and 400 are connected to suitable logic circuits, to be described below, to enable and disable the C/D 74 to properly count the air pressure signals, as described above.

Referring now to FIG. 5, the update circuits 92 are interconnected with the readout selector circuit 85 for updating the C/D 74 for counting a new function in response to actuation of the switch portion 58a to each position thereof, and are as follows. A two input NAND gate 404 and a three input NAND gate 406 are connected to form a flip-flop which is referred to hereinafter as the strobe flip-flop. An output of the strobe flip-flop at a line 408 connected to the output of the NAND gate 406 forms one input to a two input NOR gate 410, whose output is connected via a buffer 412 to the terminal 262, which is the same terminal as the like numbered terminal 262 of FIG. 6, connected via the line 260 to the strobe inputs of the counter/latch drivers 252, 254, 256 and 258. The opposite input of the NOR gate 410 is connected via a capacitor 414 to the output of an update one shot comprising a two input NOR gate 416 and an inverter 418. The output of the gate 416 is connected via a capacitor 420 to the input of the inverter 418 whose output is connected via a line 422 to one input of the NOR gate 416 and to one end of the capacitor 414 whose other end is connected via a resistor 424 to ground and to the aforementioned input of the NOR gate 410. The input of the inverter 418 is also connected via a resistor 421 to a positive voltage supply. Thus, the latch portions of the counter/latch-drivers 252 through 258 of FIG. 6 are adapted to follow the counter portions thereof as long as the strobe inputs thereof connected to the line 260 are at logic "0" and are adapted to retain the contents of the counter portion, when the strobe inputs at the line 260 are at logic "1". The line 260 will be at logic "0" when the strobe flip-flop is set or when the update one shot fires.

Terminal A of the switch portion 58a is connected via a line 426 to one input of a two input NAND gate 428, whose output is connected to one input of a two input NAND gate 430, whose output is connected to one input of the NOR gate 416 of the update one shot. Terminals B and C of the switch portion 58a are connected to the respective inputs of the two input NOR gate 432 whose output is connected to ground via a capacitor 434 and to one input of the three input NAND gate 406 of the strobe flip-flop. Terminals D and E of the switch portion 58a are connected to the respective inputs of a two input NOR gate 436 whose output is connected via a line 438 to one input of a two input NOR gate 440 whose output is connected to one input of a four input NOR gate 442. The output of the NOR gate 442 is connected through a buffer 444 to the terminal 270 which corresponds to the terminal 270 of FIG. 6 connected with the reset inputs of the counter/latch-drivers 252 through 258. The output of the gate 442 is also connected to one input of a three input NAND gate 446 whose output is connected via a capacitor 448 to a resistor 450 whose other end is connected to ground and to the input of an inverter 452 whose output is connected to a second input of the three input NAND gate 446 to form a one shot. The third input of the NAND gate 446 is connected by a line 447 to the output of the NOR gate 407. The output of the one shot at the junction of the capacitor 448 with the inverter 452 is connected via a buffer 454 to the terminal 266 which is the same terminal as the like numbered terminal 266 of FIG. 5 connected via the line 264 to the blanking input of the counter/latch-decoders 252 through 258. The junction of the capacitor 448 with the inverter 452 is also connected via a resistor 456 to the anode of a diode 458 whose cathode is connected to the junction of the output of the NOR gate 436 with one input of the two input NOR gate 440. The output of the inverter 375 whose input is connected to the terminal A of the switch 48, is connected to one input of a two input NOR gate 460, whose output is connected to a second input of the four input NOR gate 442.

The outputs of the NAND gates 396 and 400 are connected to two inputs, respectively, of a three input NAND gate 462 which is connected with a two input NAND gate 464 to form a flip-flop. The remaining input of the two input NAND gate 464 is connected via a line 466 to the line 204 at the output of the inverter 196 of the reset circuit 98. An output of the flip-flop comprising the gates 462 and 464, at the output of the gate 462 thereof, is connected to the remaining input of the two input NOR gate 440. The output of the NAND gate 396 is also connected to one input of a two input NOR gate 468. Similarly, the output of the NAND gate 400 is also connected to one input of a two input NOR gate 470. The opposite inputs of the two NOR gates 468 and 470 are connected in common to a cathode of a diode 472 whose anode is connected to the output of the flip-flop comprising the gates 462 and 464 at the output of the gate 464 thereof. A resistor 474 is connected in parallel with the diode 472, and a capacitor 476 is connected between the cathode of the diode 472 and ground. The outputs of the NOR gate 468 and 470 are connected to the respective inputs of a two input NOR gate 478, whose output is connected to the remaining input of the two input NAND gate 430.

The strobe flip-flop (comprising the gates 404 and 406) is set whenever either the readout selector switch portion 58a or the auto/manual/step switch 68 are actuated, producing a reset pulse at the output of the NAND gate 206. The output of the NOR gate 206 is connected via a line 405 to one input of the two input NOR gate 407, whose output is connected to the remaining input of the three input NAND gate 406 of the strobe flip-flop, and via the lines 405 and 443 to a third input of the four input NOR gate 442. The fourth input of the NOR gate 442 is connected via a line 445 to the output of the NOR gate 416 of the update one shot which output is also connected via a line 417 to an input of the strobe flip-flop at the remaining input of the two input NAND gate 404 thereof.

The output of the NAND gate 436, whose inputs are connected to the terminals D and E of the switch portion 58a, is connected via the series combination of an inverter 480 and a buffer 482 to a terminal 484 which is the same as the like numbered terminal 484 of FIG. 6 which is connected via a line 486 to a decimal point input terminal of the counter/latch-driver circuit 258, for actuating the decimal point of the seven-segment display element 84, associated therewith, when either of the drum air pressure sensors is selected by the readout selector switch portion 58a. It will be appreciated that this arrangement allows the display portion 60 to provide a clear and easily readable display of air pressure to a resolution of tenths of an ounce per square inch. A two input NOR gate 488 has its output connected to the remaining input of the two input NOR gate 407 and via a line 490 to the anode of a diode 492 whose cathode is connected to the input of the buffer 454. A two input NOR gate 494 has inputs connected to terminals A and B of the switch portion 58a, respectively, and an output connected to the input of an inverter 496 whose output is connected to a terminal 498. The output of the NOR gate 494 is also connected via a line 500 to one input of the two input NOR gate 488 and to a terminal 502. The remaining input of the two input NOR gate 488 is connected by a line 504 to a terminal 506 which is connected to receive a signal from the alarm circuit 113 to be described in detail hereinbelow. The remaining input of the two input NOR gate 460 is connected to a terminal 508 and the output on line 212 of the NAND gate 206 is connected to a terminal 510, the terminals 508 and 510 being identical with the like numbered terminals of FIG. 6.

Referring to FIG. 6, the terminal 508 is connected via a resistor 512 to the output of the NOR gate 343 which is also an output of the flip-flop comprising NOR gates 341 and 343, and a capacitor 514 is connected between the terminal 508 and ground. The terminal 510 is connected with one input of the three input NOR gate 343 which also comprises an input to the flip-flop comprising NOR gates 341 and 343. Similarly, the remaining input of the two input NAND gate 428 of FIG. 5 is connected to a terminal 516 which is connected in FIG. 6 to the output of the NOR gate 358.

Figure 7:
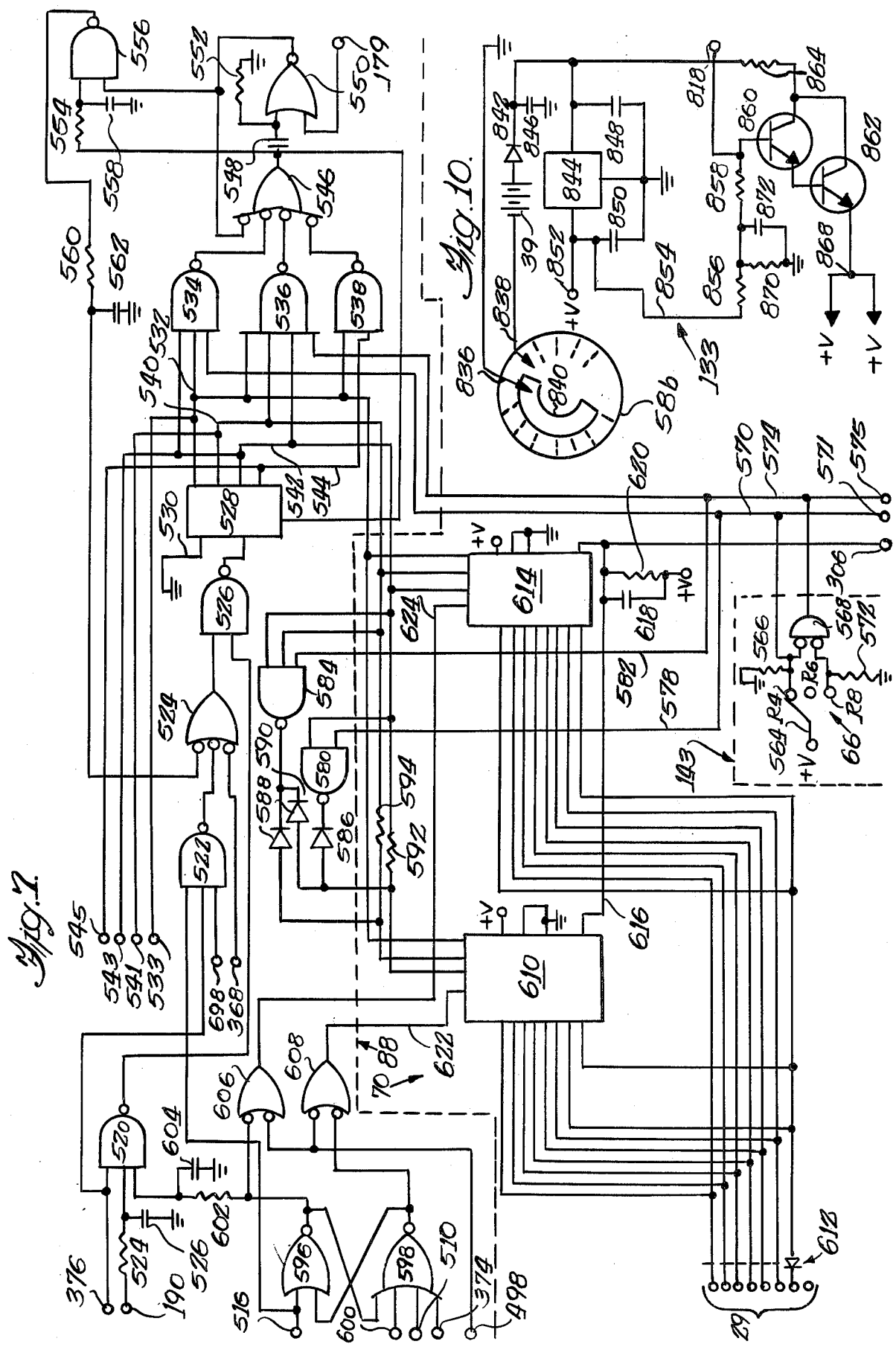

Referring now to FIG. 7, a remaining portion of the multiplexer circuit 70 and the row select circuit 88 are illustrated in additional detail. The row select circuit 88 determines which seed sensor will be presented to the C/D 74 from the terminal 306 of FIG. 6 and via the above described logic circuitry thereof forming the first portion of the multiplexer circuits 70. The terminal 376 from the automatic/manual/step circuit 103 of FIG. 5 is connected to one input of the three input NAND gate 520 and to one input of a three input NAND gate 522. The terminal 190 from the flip-flop comprising gates 176 and 178 of the reset circuit 98 of FIG. 5 is connected via a resistor 524 to a second input of the three input NAND gate 520, which input is connected via a capacitor 526 to ground. A second input of the three input NAND gate 522 is connected to the terminal 516 from the output of the NOR gate 358 of the drum divide-by-four circuit 134 of FIG. 6. The output of the NAND gate 522 is connected to one input of a three input NAND gate 524, a second input of which is connected to the terminal 368 from the output of the one shot comprising the NOR gate 240 and inverter 242 of the automatic/manual/step circuit 103 of FIG. 5. The output of the NAND gate 524 is connected to one input of a two input NAND gate 526 whose other input is connected to the output of the NAND gate 520. The output of the NAND gate 526 is connected to an input of a counter 528, which has a clock input 530 connected to ground. Four outputs of the counter 528 in conjunction with a flip-flop comprising NOR gates 596 and 598, described below, control which seed sensor is to be selected for display, and counter 528 provides an appropriate signal to the decoder/driver 118, to be described in further detail hereinbelow for displaying a number on the display portion 61 corresponding to the seed sensor whose count is being displayed. The first output of the counter 528 is connected to a line 532, the line 532 also being connected with one input of a three input NAND gate 534, with one input of a four input NAND gate 536 and with one input of a two input NAND gate 538. The second output of the counter 528 is connected to a line 540 which is also connected with a second input of the four input NAND gate 536. The third output of the counter 528 is connected to a line 542 which is also connected with a second input of the three input NAND gate 534 and with a third input of the four input NAND gate 536. The fourth output of the counter 528 is connected to a line 544 which is also connected with the second input of the two input NAND gate 538. The outputs of the NAND gates 534, 536 and 538 are connected to three inputs of a four input NAND gate 546, whose output is connected to a reset input of the counter 528 and, via a capacitor 548 to one input of a two input NOR gate 550, which input is connected via a resistor 552 to ground. The opposite input of the two input NOR gate 550 is connected to the terminal 179 from the output of the flip-flop comprising gates 176 and 178, of the reset circuit 98 of FIG. 5. The output of the NAND gate 546 is also connected via a resistor 554 to one input of a two input NAND gate 556 which input is connected via a capacitor 558 to ground. The output of the NOR gate 550 is connected to the second input of the two input NAND gate 556 and to the fourth input of the four input NAND gate 546. The output of the NAND gate 556 is connected via a resistor 560 to the third input of the three input NAND gate 524 which input is connected via a capacitor 562 to ground. The number of rows select circuit 143 includes the switch 66 which is actuatable to one of three positions, corresponding to the number of rows which the planter being monitored is adapted to plant simultaneously. The switch 66 includes a movable contactor 564 connected to a positive voltage supply and three terminals R4, R6 and R8 to which the contactor 564 is movable for selectively contacting or engaging and corresponding to four rows, six rows and eight rows, respectively. The terminal R6 open circuits the switch 66. The terminal R4 is connected to ground via a resistor 566, to one input of a two input NOR gate 568 and to a line 570 connected to a terminal 571 and to the third input of the three input NAND gate 534. Similarly, the terminal R8 is connected to ground via a resistor 572 and to the second input of the two input NOR gate 568 whose output is connected to a line 574 which is connected to a terminal 575 and to the fourth input of the four input NAND gate 536. The line 570 is also connected via a line 578 to one input of a two input NAND gate 580 whose other input in connected to the line 542. Similarly, the line 574 is also connected via a line 582 to one input of a three input NAND gate 584 whose second input is connected to the line 542 and whose third input is connected to the line 540. The output of the NAND gate 580 is connected to the cathode of a diode 586, and the output of the NAND gate 584 is connected to the cathode of a diode 588 and to the cathode of a diode 590. The anodes of the diodes 586 and 590 are connected together. A resistor 592 is connected between the anodes of the diodes 586 and 590 and the input on the line 542 of the NAND gate 580. Similarly, a resistor 594 is connected between the anode of the diode 588 and the input on the line 540 of the NAND gate 584.

Referring to the middle left-hand side of FIG. 7, a two input NOR gate 596 and a four input NOR gate 598 are connected to form a flip-flop, as mentioned above. An input to the flip-flop at the remaining input of the two input NOR gate 596 is connected to the terminal 516 from the output of the NOR gate 358 of the drum divide-by-four circuit 134 of FIG. 6. Other inputs to the flip-flop comprising the gates 596 and 598 include a second input of the four input NOR gate 598 connected to the terminal 374 from the automatic/manual/step circuit 103 of FIG. 5, a third input of the gate 598 connected to the terminal 510 from the NAND gate 206 of the reset circuit 98 of FIG. 5, and a fourth input of the gate 598 connected to a terminal 600 from the RFAIL circuit 110, to be described in further detail below. One output of the flip-flop comprising the gates 596 and 598, at the output of the gate 596, is connected to one input of a two input NAND gate 606, via a resistor 602 to the third input of the three input NAND gate 520 which input is also connected via a capacitor 604 to ground. The opposite output of the flip-flop comprising the gates 596 and 598, at the output of the gate 598 thereof, is connected with one input of a two input NAND gate 608. The remaining inputs of the two input NAND gates 606 and 608 are connected in common to the terminal 498 from the inverter 496 of FIG. 5.

The seed sensor lines 29 are connected at the lower left-hand portion of FIG. 7 to a corresponding number of lines connected with the input terminals of a multiplexer 610. A corresponding number of diodes designated generally 612 have their cathodes connected to each of the lines from the seed sensors lines 29 and their anodes connected to a corresponding input of the multiplexer 610. The last input of the multiplexer 610 is connected in common with the first input of a second multiplexer 614, whose other inputs are connected in common with each of the remaining corresponding inputs of the multiplexer 610. The multiplexers 610 and 614 are provided with suitable connections to a positive voltage supply and to ground, and have their outputs on a line 616 connected in common, the line 616 being connected to the terminal 306 of FIG. 6. The line 616 is also connected to a suitable positive voltage supply via the parallel combination of a capacitor 618 and a resistor 620.

Control inputs of the multiplexers 610 and 614 are connected as follows. An inhibit input of the multiplexer 610 is connected via a line 622 to the output of the NAND gate 608. Similarly, the inhibit input of the multiplexer 614 is connected via a line 624 to the output of the NAND gate 606. First, second and third address control inputs of the multiplexer 614 are connected to the lines 542, 540 and 532 from the output of the counter 528, respectively. Similarly, first, second and third address control inputs of the multiplexer 610 are connected via the resistor 592 to the line 542, via the resistor 594 to the line 540, and to the line 532, respectively.

It will be appreciated that the foregoing row select and multiplexer circuits provide the proper sensor input to the C/D to be counted and/or displayed thereby when the readout selector switch 58a of FIG. 5 is in the A or B position. When switch 58a is in the A position, the foregoing function is performed either automatically, when the auto/manual/step switch 68 is in the auto position, or manually, the rows being individually sequentially selected in response to actuation of the switch 68 of FIG. 5 into contact with the terminal 220 thereof. Also, when the switch 68 is in the automatic position, that is the actuator is in contact with the terminal 216, the row select and multiplexer circuitry of FIG. 7 selects and presents to the C/D the next seed sensor in sequence to be counted thereby while the count from the previous seed sensor is being displayed. Also, when the switch 68 of FIG. 5 is changed from the manual to automatic position, that is from contact with the terminal 218 into contact with the terminal 216, the C/D is reset and begins counting from zero the pulses presentd by the next seed sensor connected thereto. Further, in the "seeds per revolution" position (position A) of the readout selector switch 58a, it will be appreciated that the row select and multiplexers select a new seed sensor in sequence, in the automatic mode, at the end of each four drum revolution cycle. Whether the row select circuit 88 operates in the automatic or manual mode is determined by the state of the flip-flop comprising the gates 596 and 598 which in turn is determined by the position of the switches 68 and 58a of FIG. 5. When the readout selector switch 58a is in the B or "seed count" position the seed sensors are sequentially selected by the row select circuits 88 in response to the momentary actuation of the switch 68 to position 220 in a similar fashion as described above for the A or "seeds per revolution" position of the readout selector switch 58a.

Figure 8:
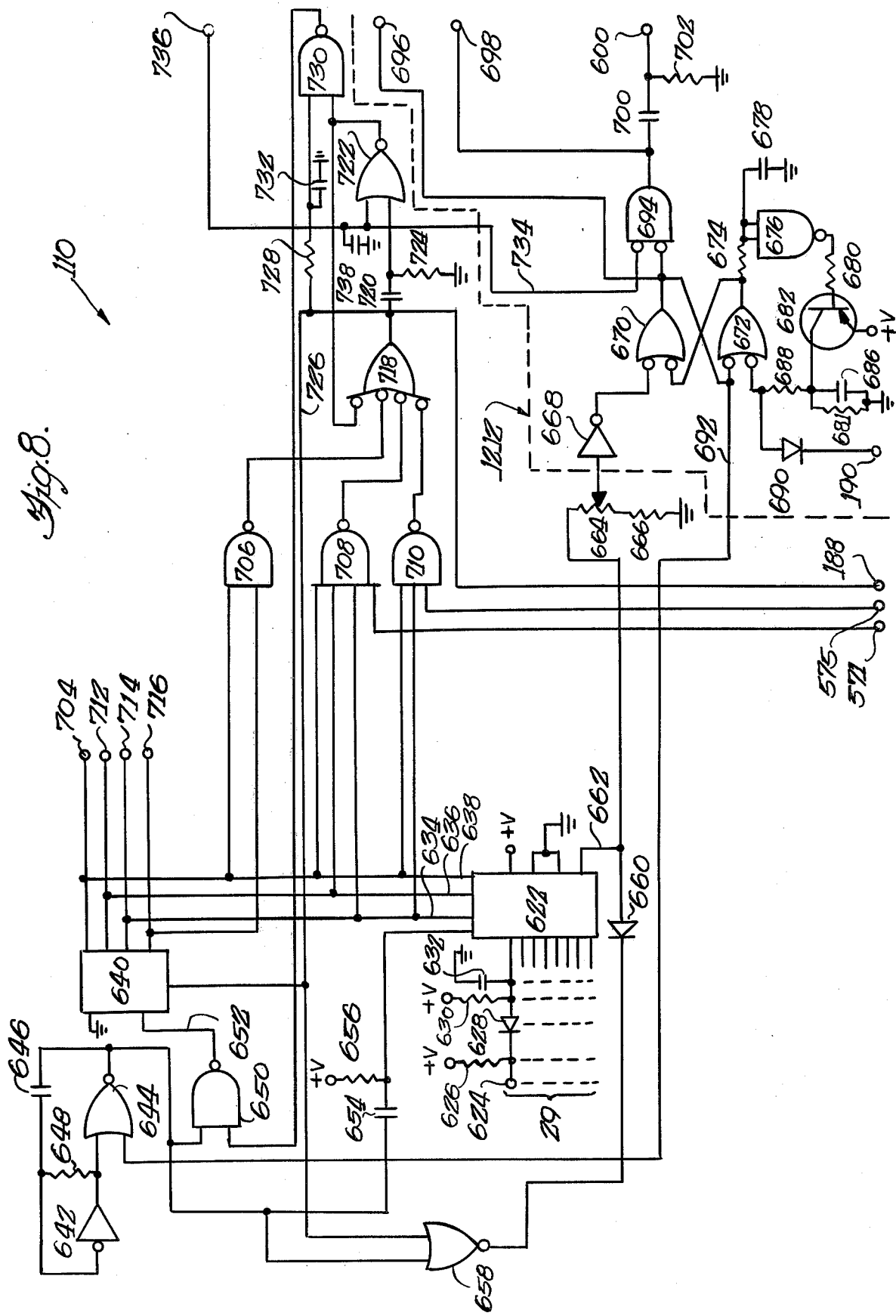

Referring now to FIG. 8, the row failure (RFAIL) circuit 110 is illustrated in additional detail. Each of the seed sensor lines 29 is connected via an identical input circuit to one input of a multiplexer 622, whereby only one such input circuit is illustrated and described in detail. A first seed sensor line is connected to an input terminal 624, which is connected via a resistor 626 to a positive voltage supply. The terminal 624 is also connected to the cathode of a diode 628 whose anode is connected to a corresponding input of a multiplexer 622. The input of the multiplexer 622 at the anode of the diode 628 is also connected via a resistor 630 to a positive voltage supply and via a capacitor 632 to ground. The multiplexer 622 is also provided with suitable connections to a positive voltage supply and to ground. The multiplexer 622 is adapted to scan the sensor inputs rapidly in sequence as controlled by three control inputs thereof connected to lines 634, 636 and 638, respectively. Suitable control signals are provided thereto from corresponding outputs of a counter 640 connected to the respective lines 634, 636 and 638. Appropriate clock signals to the counter 640 are provided by an oscillator comprising an inverter 642 and a two input NOR gate 644. The output of the inverter 642 is connected to one input of the NOR gate 644 whose output is connected via a capacitor 646 to the input of the inverter 642. A resistor 648 is connected between the input and output of the inverter 642. The output of the NOR gate 644 is also connected to one input of a two input NAND gate 650 whose output is connected via a line 652 to the input of the counter 640. The output of the NOR gate 644 is also connected via a capacitor 654 to an inhibit input of the multiplexer 622 which input is also connected via a resistor 656 to a positive voltage supply. The output of the NOR gate 644 is also connected to one input of a two input NOR gate 658, whose output is connected to the cathode of a diode 660 whose anode is connected to the output of the multiplexer 622. Thus, the oscillator comprising the gate 644 and inverter 642 drives the counter 640 via the gate 650 to provide appropriate signals at the control inputs of the multiplexer 622 on the lines 634, 636 and 638 to cause the seed sensors to be sequentially selected thereby and their signals passed to the output of the multiplexer 622 on the line 662.

The line 662 is connected to one side of a variable resistor 664 whose other end is connected via a resistor 666 to ground and whose center tap is connected to the input of an inverter 668. The output of the inverter 668 is connected to one input of a two input NAND gate 670 which is connected with a two input NAND gate 672 to form a flip-flop. The output of the NAND gate 672 is connected via a resistor 674 to both inputs of a two input NAND gate 676 which are also connected via a capacitor 678 to ground. The output of the NAND gate 676 is connected via a resistor 680 to base electrode of a PNP transistor 682 whose emitter electrode is connected to a positive voltage supply. The collector electrode of the transistor 682 is connected via the parallel combination of a resistor 684 with a capacitor 686 to ground and via a resistor 688 to the remaining input of the two input NAND gate 672, thus forming, together with the flip-flop comprising the gates 670 and 672, a single shot circuit. The junction of the resistor 668 with the input of the NAND gate 672 is also connected to the anode of a diode 690 whose cathode is connected to the terminal 190 from the reset flip-flop of FIG. 5. The output of the NAND gate 670 is connected via a line 692 to the remaining input of the two input NOR gate 644 of the oscillator circuit including the inverter 642 and NOR gate 644. The output of the NAND gate 670 is also connected to one input of a two input NOR gate 694 which is also connected to a terminal 696. The output of the NOR gate 694 is connected to a terminal 698 and via a capacitor 700 to the terminal 600 which is also connected via a resistor 702 to ground and, in FIG. 6 to the remaining input of the three input NOR gate 343 which is also connected via a capacitor 601 to ground. The output of the counter 640 on the line 638 is connected to a terminal 704, to one input of a two input NAND gate 706, to one input of a four input NAND gate 708, and to one input of a three input NAND gate 710. The output of the counter 640 on the line 636 is connected to a terminal 712, and to a second input of the four input NAND gate 708. The output of the counter 640 on the line 634 is connected to a terminal 714, to a third input of the three input NAND gate 708 and to a second input of the three input NAND gate 710. The fourth input of the four input NAND gate 708 is connected to the terminal 571 and the third input of the three input NAND gate is connected to the terminal 575, the terminals 571 and 575 being connected to the outputs of the row select circuit 143 of FIG. 7. A fourth output of the counter 640 is connected to a terminal 716 and to the second input of the two input NAND gate 706. The outputs of the NAND gates 706, 708 and 710 are connected to three inputs of a four input NAND gate 718 whose output is connected via a capacitor 720 to one input of a two input NOR gate 722 which input is also connected via a resistor 724 to ground. The output of the NOR gate 722 is connected to the fourth input of the four input NAND gate 718. The output of the NAND gate 718 is also connected via a line 726 to the reset input of the counter 640 and to the second input of the two input NOR gate 658. The output of the NAND gate 718 is also connected via a resistor 728 to one input of a two input NAND gate 730 which input is connected via a capacitor 732 to ground. The opposite input of the gate 730 is connected to the output of the NOR gate 722. The output of the NAND gate 730 is connected to the remaining input of the two input NAND gate 650. The second inputs of the two input NOR gate 694 and of the two input NOR gate 722 are connected to a line 734 which is connected to a terminal 736 and via a capacitor 738 to ground.

In operation, the seed sensor to be checked for failure is selected by the multiplexer 622 as controlled by the counter 640 via the lines 634, 636 and 638. The counter 640 is advanced on the leading edge of a pulse from the oscillator comprising the gate 644 and inverter 642, via the gate 650. The negative edge of the same oscillator pulse generates a negative pulse at the inhibit input of the multiplexer 622, which causes the signal from the seed sensor selected by the address inputs 634, 646 and 638 thereof to be electrically connected to the output at line 622 thereof. The seed sensors discharge capacitor 632 through diode 628 when a seed is detected. When no seeds are present resistor 630 charges capacitor 632. Therefore a logic "1" is on each line 29 when no seeds are detected and a logic "0" whenever a seed is detected passing through the seed delivery tube associated therewith. Thus, when a seed is detected by the sensor at the input 624, for example, the capacitor 632 is drawn toward around through the diode 628. When the seed "pulse" (logic "0") ceases, the capacitor 632 begins to charge through the resistor 630. Thus, the voltage of the signal at the input of the multiplexer 622 depends on the time between pulses, i.e., the rate at which seeds are passed through the conduit associated with the sensor. Thus, the sensor selected at the multiplexer 622 will present a corresponding signal at the line 622. The next positive half-cycle of the oscillator comprising the gate 644 and inverter 642 holds the line 662 low, through the gate 668 and diode 660, to remove any signal thereon from the previous cycle. When the signal at the center tap of the variable resistor 664 exceeds the threshold voltage of the inverter 668, the single shot comprising the flip-flop including the gates 670 and 672, the gate 676, transistor 682 and associated elements, is fired, the output of the inverter 668 being forced to logic "1". The anode of the diode 690 is also at logic "1", thereby causing the output of the gate 672 to go to logic "0", thereby maintaining the output of the gate 670 at logic "1". The output of the gate 672 going to logic "0" causes the output of the gate 676 to go to logic "1" which shuts off the transistor 682 and allows the capacitor 686 to begin discharging through resistor 681. When the voltage at the anode of the diode 690 drops below the threshold, the output of the gate 672 goes to logic "1". Thus, there exists a race condition between the output of the gate 676 going to logic "1" which causes the capacitor 686 to charge, and the output of the gate 672 going high enough to cause the output of the gate 670 to go to logic "0" which insures the output of the gate 672 staying at logic "1". Thus, the setting of the variable resistor 664 effectively determines the rate of seeds passing through the delivery tubes, below which a "failure" signal will be generated.

The resistor 674 and capacitor 678 insure that the output of the gate 670 has gone to logic "0" before the output of the gate 676 causes the capacitor 686 to charge. Thus, the single shot pulse width is independent of duty cycle. When a failure of a conduit to pass seeds therethrough is detected at the seed sensor selected by the multiplexer 622, the output of the gate 670 goes to logic "1" shutting off the oscillator comprising the gate 644 and inverter 642, via the line 692. This then stops the scanning of the sensors until the single shot comprising the flip-flop including the gates 670 and 672, the gate 676, transistor 682 and associated elements, has timed out. The output of the gate 706, 708 and 710 determine the number of rows or sensors that the sensor scanning will cover, depending on the position of the number of rows select switch 66 of FIG. 7. The outputs 704, 712, 714 and 716 of the counter 640 also provide appropriate signals to the decoder/driver circuit, to be described below, for providing a numerical indication on the display portion 61 corresponding to the seed sensors, if any, at which a failure is detected by the RFAIL circuit 110. The provision of the gates 718, 722 and 730 and associated elements, provides a reset for the counter 640 when last seed sensor has been sequentially monitored via the multiplexer 622 and generates an extra clock signal for the counter, to by-pass the 0 position, as no seed sensor bears the identification number 0, for purposes of the display portion 61.

Figure 9:
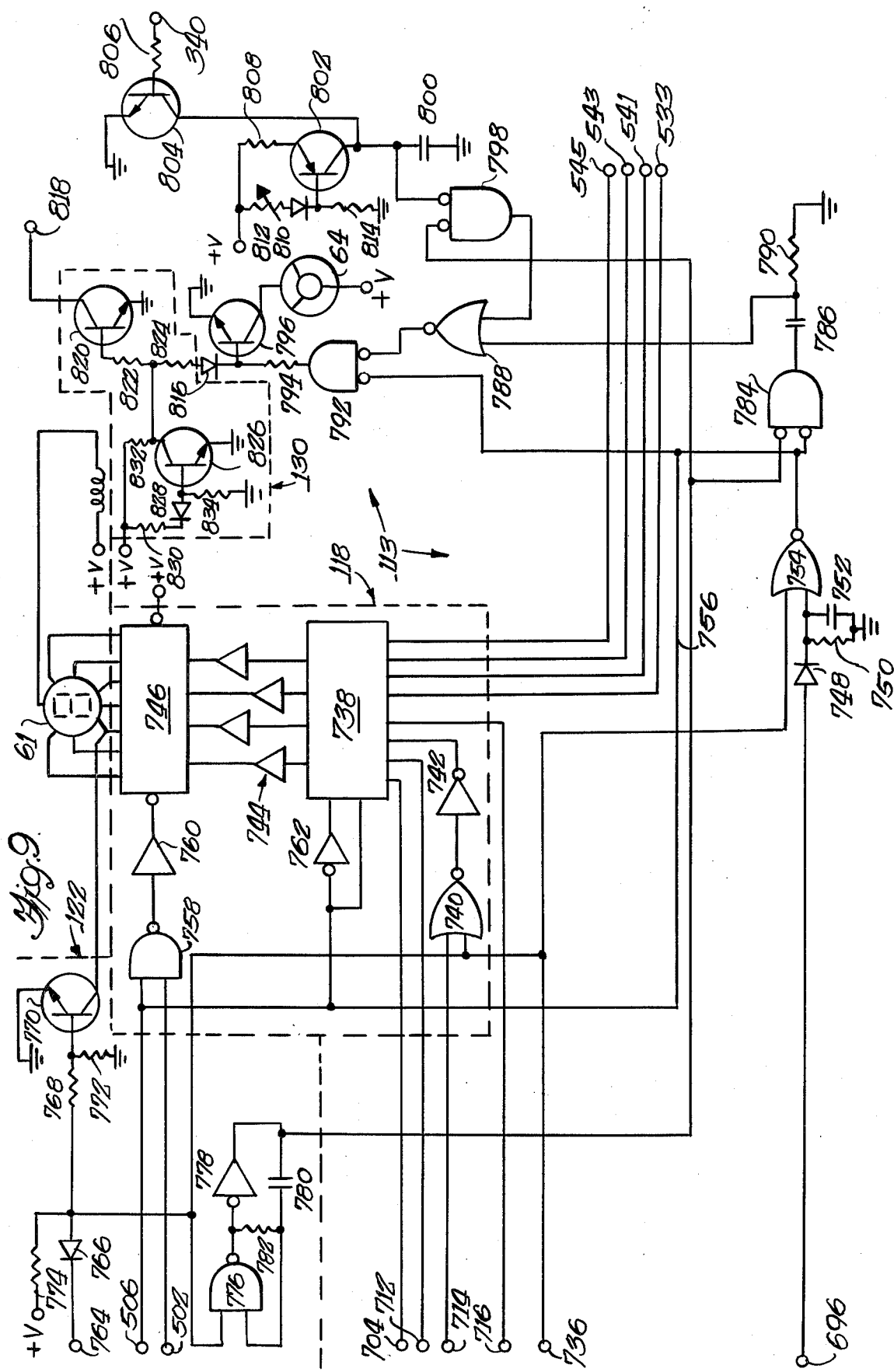

Referring now to FIG. 9, a decoder driver circuit 118 is connected with both the row failure circuit of FIG. 8, and with the row select circuit 88 of FIG. 7, for driving the display portion 61 in response thereto to indicate either the identity of the seed sensor for which a count is being displayed on the display portion 60 or for identifying the seed sensor at which a failure to pass seeds has been detected by the circuit of FIG. 8. A quad AND/OR select gate 738 has four inputs connected to the terminals 533, 541, 543 and 545, respectively from the counter 528 of FIG. 7 and three input lines connected to the terminals 704, 712 and 716, respectively, from the counter 640 of FIG. 8. The terminal 714 from the counter 640 of FIG. 8 is connected to one input of a two input NOR gate 740 whose output is connected via an inverter 742 to the remaining input of the select gate 738. The four outputs of the quad AND/OR select gate 738 are connected via four buffers, designated generally 744 to the four inputs of a decoder/driver circuit 746 which is connected to the display portion 61 which comprises a seven-segment display element. The terminal 696 from the RFAIL circuit 110 of FIG. 8 is connected to the anode of a diode 748 whose cathode is connected to ground via the parallel combination of a resistor 750 and a capacitor 752, and to one input of a two input NOR gate 754 whose output is connected via a line 756 to one input of a two input NAND gate 758 and to the terminal 506 at the input of the NOR gate 488 of FIG. 5. The second input of the NAND gate 758 is connected to the terminal 502 from the output of the NOR gate 494 of FIG. 5 whose inputs are connected to the switch terminals A and B as described above. The output of the NAND gate 758 is connected via a buffer 760 to a blanking input of the decoder/driver 746. The line 756 from the output of the NOR gate 754 is also connected to one of two control inputs of the select gate 738 and, via an inverter 762 to the other control input of the select gate 738, for providing appropriate signals thereto for selecting between the two pairs of inputs: those from the row select counter 528 of FIG. 7 and those from the RFAIL row select counter 640 of FIG. 8, respectively, to connect, via the buffer 744, to the decoder driver 746, to be displayed on the display elements 61.

The low hopper level detection circuit 122 has an input terminal 764 connected to a line 37 from the hopper level sensor 35. The terminal 764 is connected to the cathode of a diode 766 whose anode is connected via a resistor 768 to the base electrode of a transistor 770, which is also connected via a resistor 772 to ground. The emitter electrode of the transistor 770 is connected to ground. The anode of the diode 766 is also connected to one input of a two input NAND gate 776 and via a resistor 774 to a positive voltage supply. The NAND gate 776 has its output connected to the input of an inverter 778 whose output is connected via a capacitor 780 to the opposite input of the two input NAND gate 776 and a resistor 782 is connected between the output of the NAND gate 776 and the second input thereof. Thus, the NAND gate 776, inverter 778, capacitor 780 and resistor 782 form an oscillator which is turned on in response to the signal produced by the seed level sensor 35 in response to the seed level of the hopper 16 falling below a predetermined level.

The NOR gate 754 also forms an input to the alarm circuit 113. The output of the NOR gate 754 is connected to one input of a two input NOR gate 784, the other input thereof being connected to the output of the inverter 778 of the oscillator comprising the NAND gate 776 and inverter 778. The output of the NOR gate 784 is connected via a capacitor 786 to one input of a two input NOR gate 788 which input is also connected via a resistor 790 to ground. The output of the NOR gate 788 is connected to one input of a two input NOR gate 792 whose opposite input is connected to the output of the NOR gate 754. The output of the NOR gate 792 is connected via a resistor 794 to the base electrode of a transistor 796 whose emitter electrode is connected to ground and whose collector electrode is connected to one side of the alarm 64, the other side thereof being connected to a positive voltage supply. The second input of the two input NOR gate 788 is connected to the output of a two input NOR gate 798, a first input of which is connected to the output of the inverter 778 of the oscillator comprising the gate 776 and inverter 778, and whose opposite input is connected to the collector electrode of a transistor 802, to the collector electrode of a transistor 804 and via a capacitor 800 to ground. The emitter electrode of the transistor 804 is connected to ground and the base electrode thereof is connected via a resistor 806 to the terminal 340 of FIG. 6 to receive the drum rotational speed signal therefrom. The emitter electrode of the transistor 802 is connected via a resistor 808 to a positive voltage supply and the base electrode of the transistor 802 is connected to the cathode of a diode 810 whose anode is connected via a variable resistor 812 to a positive voltage supply. A resistor 814 is connected between the base electrode of the transistor 802 and ground. The base electrode of the transistor 796 is connected to a cathode of a diode 816 whose anode is connected to the output of the low voltage detector circuit 130.

An input to the low voltage detection circuit 130 comprises a terminal 818 connected to the power supply of FIG. 10, to be described below, which is connected to the collector electrode of a transistor 820 whose emitter electrode is connected to ground. The base electrode of the transistor 820 is connected via a resistor 822 in series with a resistor 824 to the anode of the diode 816. The junction of the resistor 822 with the resistor 824 is connected to the collector electrode of a transistor 826 whose emitter electrode is connected to ground. A base electrode of the transistor 826 is connected to the anode of a diode 828 whose cathode is connected via a resistor 830 to a positive voltage supply. The collector electrode of the transistor 826 is connected via a resistor 832 to a positive voltage supply, and the base electrode thereof is connected via a resistor 834 to ground.

From the foregoing description of the alarm circuit and related circuits connected thereto, it will be apparent that signals corresponding to several conditions will actuate the alarms 64. A failure of a seed delivery tube or conduit to pass seeds therethrough, as detected by the seed sensor associated therewith will, via the RFAIL circuit 110 of FIG. 8, provide an input signal at the terminal 696 to the alarm circuit of FIG. 9. The signal at the terminal 696 from the RFAIL circuit 110 will cause the alarm 64, via the above described circuit to be actuated continuously for the duration of the output of the single shot of FIG. 8. Similarly, a detection of improper voltage supplied at the terminal 818 will, via the low voltage detection circuit 130 cause the alarm 64 to be actuated continuously. A signal from the hopper level sensor 35 at the terminal 764 will activate the oscillator comprising the gate 776 and 778 to provide an input signal to the alarm circuit via the gate 784, causing the alarm 64 to actuate intermittently, in response to the oscillator signal. Also, when the drum rotational speed, to which the signal input at the terminal 340 corresponds, falls to substantially zero for a predetermined increment of time, as determined by the setting of the variable resistor 812 and choice of the capacitor 800, the alarm 64 will be deactivated thereby, to prevent a false row failure indication when the seed dispensing drum is turned off, for example, when the planter is being turned at the end of a pass over the field.

It will be appreciated, with regard to the decoder/driver circuit 118 for driving the display 61 that the select gate 738 will select the counter signals from the counter 640 of the row failure circuit when either a row failure or a low hopper condition exists, and will choose the signals from the counter 528 of the row select circuit, otherwise. In the case of a row failure indication being given, numbers corresponding to the seed sensor or sensors at which failure is detected be sequentially displayed via the decoder/driver 746 on the seven-segment display element 61. In the case of a low hopper indication, it will be noted that the NOR gate 740 via the inverter 742 will present a bcd-4 signal to the selector 738, which will be decoded as a four by the decoder/driver 746, and the transistor 770 will be turned on, the collector electrode thereof being connected to an appropriate input of the seven-segment element 61, so that together with the "four" signal from the driver 746 a capital "H" will be displayed. When there is no row failure or low hopper indication signal being given, and the row select switch 58 is not actuated to either terminal A or B thereof, calling for "seeds per revolution" or "seeds count", the display 61 will remain blank. It will further be appreciated, that with this arrangement the low hopper indication signal both at the alarm 64 and at the display 61, in effect takes precedence over the row failure indications thereby.

Referring now to FIG. 10 a power supply and associated elements is illustrated in additional detail. The selector switch 58 preferably comprises a single wafer rotatary switch, as described above, one side thereof comprising the readout selector switch 58a of FIG. 5 the other side thereof preferably comprising a shorting switch 58b as illustrated in FIG. 10 to turn the monitor on and off. A first terminal 826 of the switch 58a is connected to ground, and a second terminal 828 is connected to the negative terminal of the tractor battery 39. A contactor element 840 of the switch portion 58b is shown in FIG. 10 in the off position, corresponding to the off position of the switch portion 58a of FIG. 5. It will be appreciated that with the switch 58 in this position, the battery 39 is effectively open circuited and therefore power to the monitor is turned off. As the switch portion 58b is rotated in a clockwise direction, corresponding to actuation of the switch portion 58a of FIG. 5 to positions A through E thereof, the negative terminal of the battery 39 is connected by the contactor 840 to ground, thus completing the circuit for providing power to the monitor. The positive terminal of the battery 39 is connected to the anode of a diode 842 whose cathode is connected to the input of a voltage regulator integrated circuit 844. A suitable smoothing capacitor 846 is provided between the cathode of the diode 842 and ground. A capacitor 848 is provided between the input of the voltage regulator 844 and ground and similarly, a capacitor 850 is provided between the output of the voltage regulator 844 and ground. Thus, a suitable regulated positive DC voltage supply is provided at an output terminal 852 of the voltage regulator 844. In a preferred embodiment the voltage regulator 844 provides a regulated 8 volt DC output. A line 854 connects the regulated voltage output terminal 852 via resistors 856 and 858 connected in series to the base electrode of a transistor 860. A transistor 862 is connected to the transistor 860 to form a Darlington pair. The collector electrodes of the transistors 860 and 862 are connected via resistor 864 to the cathode of the diode 842. The emitter element of the transistor 860 is connected to the base electrode of the transistor 862 and the emitter electrode of the transistor 862 is connected to a terminal 868 which provides a positive 5 volt DC power supply, which is preferably connected by one line to provide power for the display elements, and by a separate line to provide DC power to the logic elements requiring a 5 volt supply. The junction of the resistor 856 with the resistor 858 is connected via the parallel combination of a resistor 870 with a capacitor 872 to ground. The terminal 818 from the low power detector circuit 130 of FIG. 9 is connected to the base electrode of the transistor 860. Thus, it will be appreciated that when the transistor 820 of FIG. 9 is turned on in response to a low voltage detection by the circuit 130, it will effectively switch off the power at the base electrode of the transistor 860 thereby switching off the positive voltage supply to the display elements, causing the display elements to go blank in response to a low voltage detection.

The embodiment of the monitor circuit shown in FIG. 3 and in detail in FIGS. 5 through 10 is also suitable, with modifications illustrated in FIG. 4 and FIGS. 11 through 14, for use with a planter adapted to plant up to 16 rows of seeds simultaneously. A seed planting machine adapted to plant up to 16 rows is substantially similar to the seed planting machine described above, with the exception that two independently driven rotating drums are provided, each associated with one half of the seed delivery tubes. Therefore, the monitor ciruucuit of FIG. 4 is substantially similar to that of FIG. 3, with a drum select circuit 150 added thereto for selecting one of the idependently driven rotating drums being monitored, and for selecting the proper drum in conjunction with a particular seed sensor for providing a readout of seeds per revolution. Also, the display portion 61 requires an additional digital display element to accomodate the increased number of seed sensors, while the readout selector switch 58a has another terminal added for selecting the rotation sensor associated with the second drum. Similarly, the circuits of FIGS. 5 through 10 are suitable for use with a 16 row planter, with some additional circuits and modifications, as illustrated in FIGS. 11 through 14.

Figure 11A:
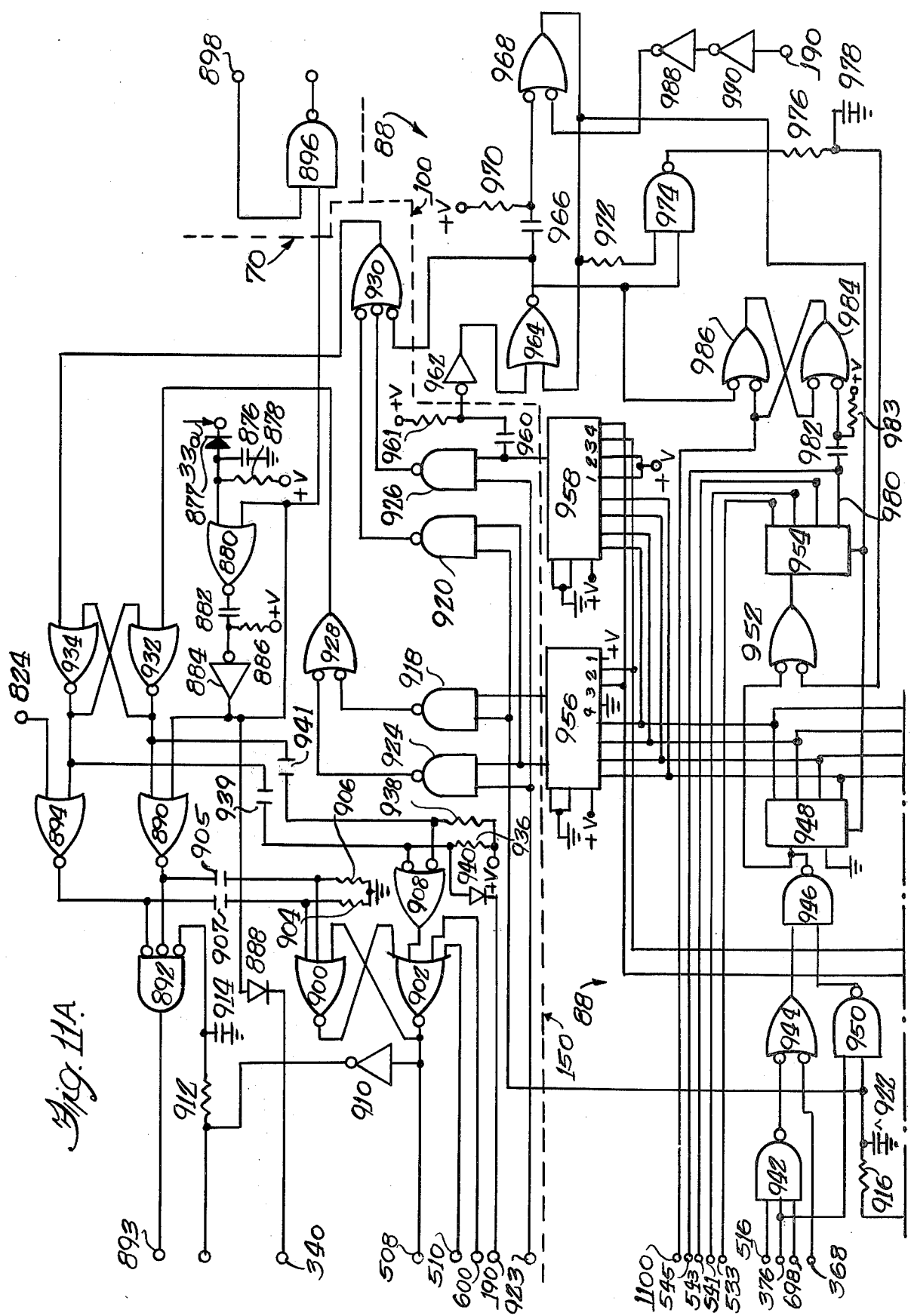
FIGS. 11 through 14 are schematic circuit diagrams of portions of the monitor circuit of FIG. 4.
Figure 11B:
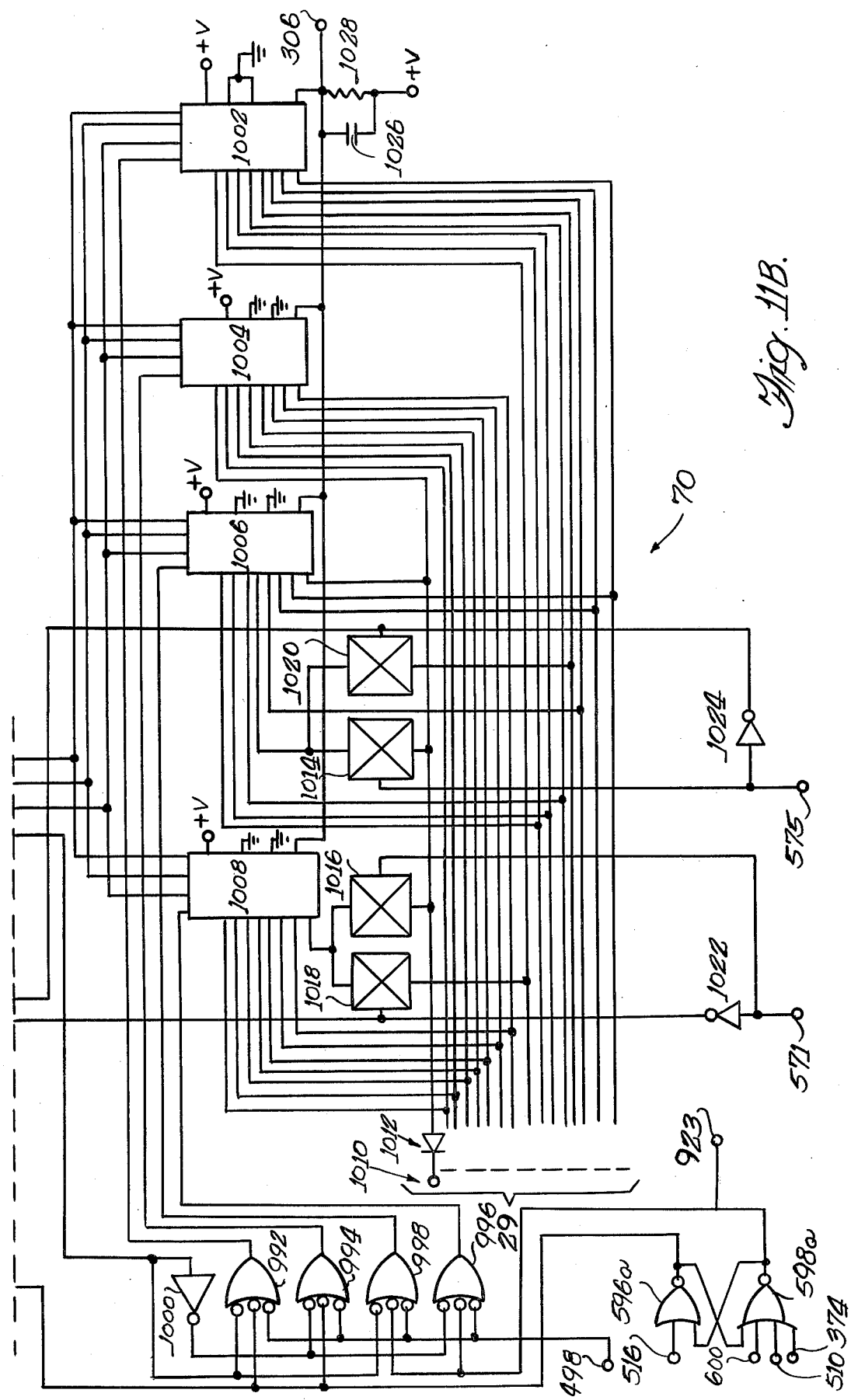

Referring now to FIGS. 11a and 11b, the drum select circuit 150 is shown in detail, together with circuits replacing the row select circuit 88 and the second portion of the multiplexer circuit 70 of the first embodiment, as shown in FIG. 7 thereof. The function of the latter circuits is equivalent to that described above with reference to the circuits of FIG. 7, however, the present circuits are adapted to select automatically or manually, in sequence, individual ones of up to 16 seed sensors.

Inputs to the drum select circuit 150 include a terminal 824 at the upper center portion of FIG. 11A from the output of the gate 336 of FIG. 6, which carries the signal from the rotation sensor associated with the first of the two drums, and a line 33a from the drum rotation sensor associated with the second drum. The line 33a is connected to the cathode of diode 877 the anode of which is connected through via a capacitor 876 to ground and via a resistor 878 to a positive voltage supply, and is connected to one input of a two input NOR gate 880, whose output is connected via a capacitor 882 to the input of an inverter 884 whose output is connected to the second input of the NOR gate 880. A resistor 886 is connected between the input of the inverter 884 and a positive voltage supply. Thus the gate 880 and inverter 884 form a one shot circuit identical to the one shot circuit comprising the gate 328 and inverter 336 of FIG. 6. The output of the inverter 884 is also connected to the anode of a diode 888 whose cathode is connected to the terminal 340 of the alarm circuit of FIG. 9. The output of the inverter 884 is also connected to one input of a two input NOR gate 890, whose output is connected to one input of a three input NOR gate 892. The terminal 824 is connected to one input of a two input NOR gate 894 whose output is connected to a second input of the three input NOR gate 892 whose output at a terminal 893 is connected to the count input of the divide-by-four counter comprising the flip-flops 352 and 354 of FIG. 6, the gates 892 and 894 replacing the gate 350 and inverter 348 of FIG. 6. The output of the inverter 884 is also connected to one input of a two input NAND gate 896, whose opposite input is connected to a terminal 898 of the readout selector switch, illustrated below in FIG. 13, and whose output is connected to the input of the gate 302 of FIG. 6, replacing the positive voltage supply connected thereto in the first embodiment.

The outputs of the NOR gates 890 and 894 are also connected to two inputs of a three input NOR gate 900 via capacitors 905 and 907 respectively the inputs also being connected to ground through resistors 904 and 906. The gate 900 is connected with a four input NOR gate 902 to form a flip-flop. A second input of the four input NOR gate 902 is connected to the output of a two input NAND gate 908. Third and fourth inputs of the four input NOR gate 902 are connected to the terminal 510 from the reset circuit of FIG. 5 and to the terminal 600 from the row circuit of FIG. 8, respectively. The output of the NOR gate 902 is connected to the input of an inverter 910 whose output is connected via resistor 912 to the remaining input of the three input NOR gate 892, which input is also connected via a capacitor 914 to ground. The output of the inverter 910 is also connected to the SET inputs of the D flip-flops 352 and 354 of FIG. 6 and to the inputs of the gates 358 and 364 connected thereto. It will be appreciated that the flip-flop comprising the gates 900 and 902 and the associated elements replace the flip-flop comprising the gates 341 and 343 and associated elements of FIG. 6.

Referring to FIG. 11b, a two input NOR gate 596a and a four input NOR gate 598a are connected to form a flip-flop, which replaces the flip-flop comprising the gates 596 and 598 of FIG. 7. The output of the NOR gate 596a is connected, in FIG. 11a, via a resistor 916 to one input of a two input NAND gate 918 and to one input of a two input NAND gate 920, which inputs are also connected via a capacitor 922 to ground. Similarly, the output at a terminal 593 of the NOR gate 598a is connected, in FIG. 11A, to one input of a two input NAND gate 924 and to one input of a two input NAND gate 926. The outputs of the NAND gates 918 and 924 are connected to the respective inputs of a two input NAND gate 928, and similarly, the outputs of the NAND gates 920 and 926 are connected to two inputs, respectively, of a three input NAND gate 930. The output of the NOR gate 928 is connected to one input of a two input NAND gate 932, and the output of the NAND gate 930 is connected to one input of a two input NOR gate 934. The NOR gates 932 and 934 are connected together to form a flip-flop. The output of the NOR gate 934 is connected to the opposite input of the two input NOR gate 894, and the output of the gate 932 is connected to the remaining input of the two input NOR gate 890. The outputs of the NOR gates 932 and 934 are also connected via capacitors 939 and 941 to the respective inputs of the two input NAND gate 908, which are also connected via resistors 936 and 938, respectively, to a positive voltage supply. The input of the NAND gate 908 connected to gate 934 via capacitor 939 is also connected to the anode of a diode 940, whose cathode is connected to the terminal 190 of the reset flip-flop of FIG. 5.

Referring now to the row select circuit 88, a three input NAND gate 942 has a first input connected to the output of the drum divide-by-four circuit at the terminal 516 of FIG. 6, a second input connected to the terminal 376 from the auto/manual circuit 103 of FIG. 5, and a third input connected to the terminal 698 from the row failure circuit of FIG. 8. The output of the NAND gate 942 is connected with one input of a two input NAND gate 944 whose opposite input is connected to the terminal 368 from the auto/manual circuit 103 of FIG. 5. The output of the NAND gate 944 is connected to one input of a two input NAND gate 946 whose output is connected to an input of a four bit counter 948. The second input of the two input NAND gate 946 is connected to the output of a two input NAND gate 950 whose first input is connected to the terminal 376 from the auto/manual circuit 103 of FIG. 5, and whose second input is connected via the resistor 916 to the output of the NOR gate 596a of FIG. 11b. The output of the NAND gate 946 is also connected to one input of a two input NAND gate 952 whose output is connected to the input of a second four bit counter 954, which is substantially similar to the counter 948. The four outputs of the counter 948 are connected, respectively, to four "A" inputs of a four bit magnitude comparator 956 which has an "A equal B" output connected to the second inputs of the two input NAND gates 924 and 920, and which has an "A greater than B" output connected to the second input of the two input NAND gate 918. The "A" inputs of the comparator 956 are also connected in common with four "A" inputs of a second, substantially identical four bit magnitude comparator 958 which has an "A equal B" output connected with the remaining input of the two input NAND gate 926. The "A equal B" output of the comparator 958 is also connected via a capacitor 960 to the input of an inverter 962 which is also connected through a resistor 961 to tv and whose output is connected to one input of a two input NOR gate 964. The output of the two input NOR gate 964 is connected to the third input of the three input NAND gate 930, and via a capacitor 966 to one input of a two input NAND gate 968, which input is also connected via a resistor 970 to a positive voltage supply. The output of the NAND gate 968 is connected to the second input of the two input NOR gate 964, and to the reset inputs of the counters 948 and 954. The output of the NAND gate 968 is also connected via a resistor 972 to one input of a two input NAND gate 974, whose other input is connected to the output of the NOR gate 964, and whose output is connected via a resistor 976 to the second input of the two input NAND gate 952, which input is also connected via a capacitor 978 to ground. The counter 954 has four outputs connected with the respective terminals 533, 541, 543 and 545 at the inputs of the AND/OR select gate 738 of FIG. 9. The fourth output of the counter 954, on a line 980, is also connected via a capacitor 982 to one input of a two input NAND gate 984 which input is connected to tv via resistor 983. The gate 984 is interconnected with a two input NAND gate 986 to form a flip-flop. The output of the NAND gate 984, which is also an input of the NAND gate 986, is connected to an input terminal 1100 of an additional portion of the decoder/driver circuit 113, to be described below in reference to FIG. 14. The second input of the NAND gate 986 is connected to the output of the NOR gate 964. The second input of the NAND gate 968 is connected to the output of an inverter 988 whose input is connected to the output of an inverter 990, whose input is connected to the terminal 190 from the reset flip-flop comprising the gates 176 and 178 of FIG. 5.

It will be appreciated from the foregoing description, that in monitoring a planter with two independently driven drums, counting seeds per revolution requires that a seed sensor be selected simultaneously with the proper drum; that is, the drum with which the particular seed delivery conduit corresponding to the selected sensor is associated. For example, in a 16 row planter, rows one through eight are associated with the first drum and rows nine through sixteen with the second drum. Thus, the drum select circuit 150 of FIG. 11a, in conjunction with the row select circuit 88 of FIG. 11a, and in particular the counter 948 thereof selects the proper drum for the seed sensor selector. Similarly, the comparators 956 and 958 are used to switch the drum selected to the drum divide-by-four circuit 134 of FIG. 6.

Referring now to FIG. 11b a second embodiment of a portion of the multiplexer circuit 70, replacing the embodiment of the portion of the circuit 70 shown in FIG. 7, operates in conjunction with the row select circuit of FIG. 11a. The output of the NOR gate 596a of the flip-flop comprising NOR gates 596a and 598a, is connected to one input of a three input NAND gate 992 and to one input of a three input NAND gate 994. Similarly, the output of the NOR gate 598a of the flip-flop is connected to one input of a three input NAND gate 996 and to one input of a three input NAND gate 998. A second input of each of the NAND gates 992, 994, 996 and 998 is connected in common to the terminal 498 from the output of the inverter 496 of FIG. 5. The third input of each of the three-input gates 994 and 996 is connected in common to the output of an inverter 1000 whose input is connected to the fourth output of the four bit counter 948 of FIG. 11a. Similarly, the third input of each of the three input NAND gates 992 and 998 is connected directly to the fourth output of the counter 948. The output of the NAND gate 992 is connected to the inhibit input of a multiplexer 1002. Similarly, the outputs of the NAND gates 994, 998 and 996 are connected to the respective inhibit inputs of multiplexers 1004, 1006 and 1008.

The seed sensor lines 29 are connected to a corresponding plurality of terminals designated generally 1010 which are connected to the respective cathodes of a corresponding plurality of diodes designated generally 1012. For purposes of clarity only one such terminal 1010 and diode 1012 are illustrated in FIG. 11b. It will be understood however that 16 such terminals and diodes are provided, to accomodate up to 16 seed sensors. The first eight of the anodes of the diodes 1012 are connected, respectively, to eight inputs of the multiplexer 1004, while the second eight of the anodes of the diodes 1012 are connected, respectively, to the eight inputs of the multiplexer 1002. The first of the anodes of the diodes 1012 is also connected to the eighth input of the multiplexer 1006, and to the input of a bilateteral switch 1014 whose output is connected to the fourth input of the multiplexer 1006. Similarly, the first of the anodes of the diodes 1012 is connected to the input of a bilateral switch 1016 whose output is connected to the eighth input of the multiplexer 1008. The ninth of the anodes of the diodes 1012 is connected to the input of a bilateral switch 1018 whose output is connected to the eighth input of the multiplexer 1008. The tenth, eleventh and twelfth of the anodes of the diodes 1012 are connected, respectively, to the first, second and third inputs of the multiplexer 1006. The thirteenth of the anodes of the diodes 1012 is connected to the input of a bilateral switch 1020 whose output is connected to the fourth input of the multiplexer 1006. The fourteenth, fifteenth and sixteenth of the anodes of the diodes 1012 are connected, respectively, to the fifth, sixth and seventh inputs of the multiplexer 1006.

The control input of the bilateral switch 1014 is connected to the terminal 575 from the number of rows select circuit 143 of FIG. 7. Similarly, the control input of the bilateral switch 1016 is connected to the terminal 571 from the number of rows select circuit 143 of FIG. 7. The control input of the bilateral switch 1018 is connected to the output of an inverter 1022 whose input is connected to the terminal 571, and the control input of the bilateral switch 1020 is connected to the output of an inverter 1024 whose input is connected to the terminal 575. The output of the inverter 1022 is also connected to the fourth "B" input of the comparator 958 and the third "B" input of the comparator 956, both of FIG. 11a. Similarly, the output of the inverter 1024 is connected to the second "B" inputs of the comparator 956 and third "B" input of 958. The first and second "B" inputs of the comparator 958 and first "B" input of the comparator 956 are connected to a positive voltage supply, and the fourth "B" input of the comparator 956 is connected to ground.

The multiplexers 1002, 1004, 1006 and 1008 each have three control inputs, the first control inputs thereof being connected in common to the first output of the four bit counter 948, the second control inputs thereof being connected in common to the second output of the counter 948, and the third control inputs thereof being connected in common with the third output of the counter 948. The outputs of the multiplexers 1002, 1004, 1006 and 1008 are connected in common to the terminal 306 of FIG. 6, which terminal is also connected via the parallel combination of a capacitor 1026 and a resistor 1028 to a positive voltage supply.

It will be appreciated then, that the foregoing circuit determines which sensor will be presented to the C/D 74 for counting when the selector 58a is contacting either the A or B terminals thereof and also, via the counter 954, provides the proper number to be displayed in the sensor identification display portion 61. The circuit also operates either in the automatic or manual mode of selection, under the control of the auto/manual circuit 103 of FIG. 5, in a similar fashion as that described above for the first embodiment. It will be appreciated, in this embodiment, that the number of rows select circuit 143 of FIG. 7 provides appropriate signals for the row select and multiplexer circuits of FIGS. 11a and 11b to operate in conjunction with eight row, twelve row and sixteen row planters, respectively, rather than the four, six and eight rows of the first embodiment.

Figure 12:
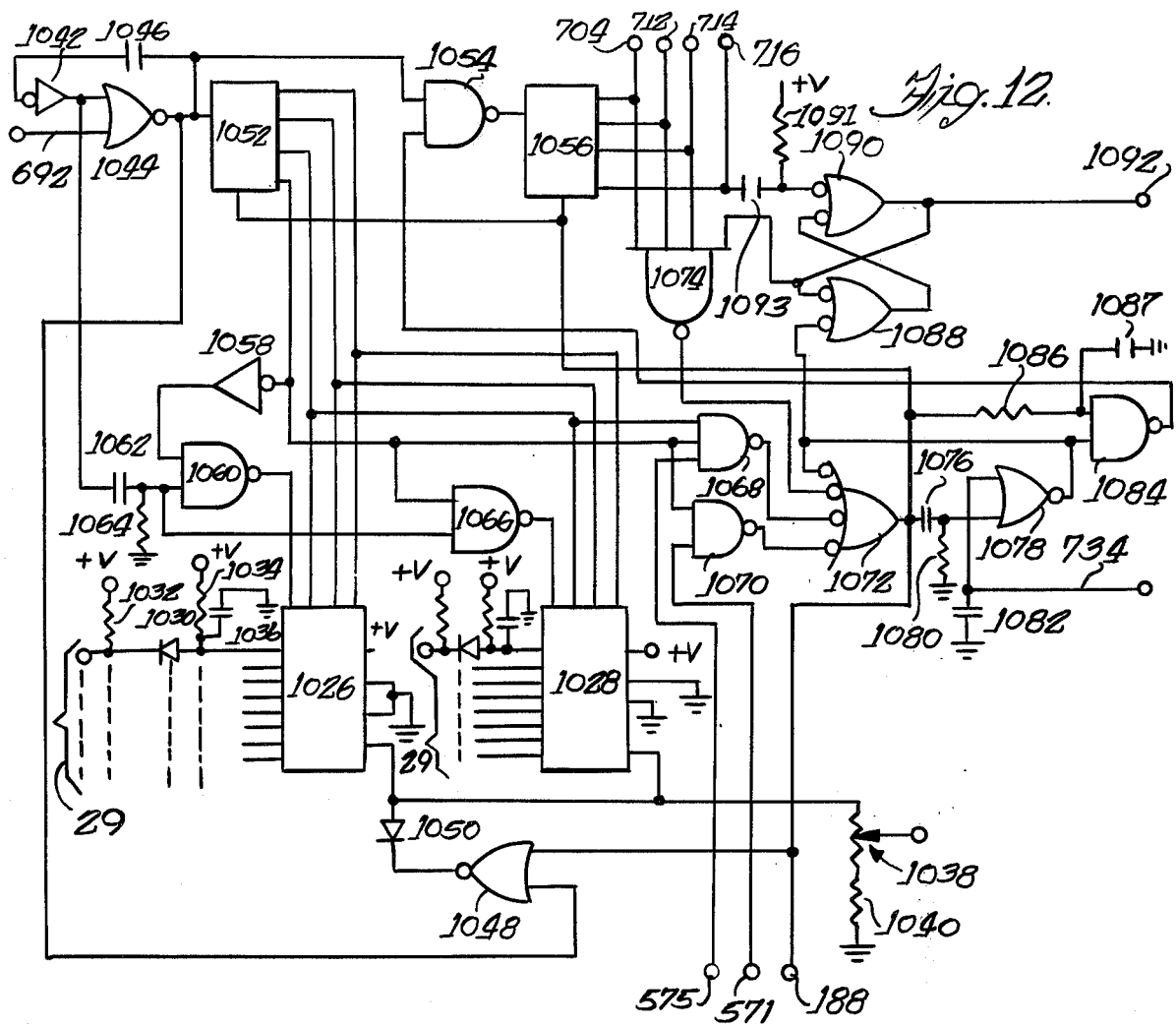

Referring now to FIG. 12, an alternate embodiment for a portion of the RFAIL circuit 110 of FIG. 8, is illustrated. The respective seed sensor lines 29 are each connected by a corresponding input circuit to corresponding inputs of one of two multiplexers 1026 and 1028, which are adapted to handle up to 16 seed sensors. An identical input circuit is associaetd with each of the iputs of the multiplexers 1026 and 1028, whereby only one such input circuit will be described in detail. A seed sensor input line 29 is connected to the cathode of a diode 1030 which is also connected via a resistor 1032 to a positive voltage supply. The anode of the diode 1030 is connected to a first input of the multiplexer 1026, which is also connected via a resistor 1034 to a positive voltage supply and via a capacitor 1036 to ground. The outputs of the multiplexers 1026 and 1028 are connected in common to one side of a variable resistor 1038 whose other side is connected via a resistor 1040 to ground. The center tap of the variable resistor 1058 is connected to the input of the inverter 668 of FIG. 8. Referring to the upper left-hand portion of FIG. 12, an inverter 1042 has its output connected to one input of a two input NOR gate 1044 whose opposite input is connected to the line 692 of FIG. 8, and whose output is connected via a capacitor 1046 to the input of the inverter 1042, to form an oscillator. The output of the NOR gate 1044 is connected to one input of a two input NOR gate 1048 whose output is connected to a cathode of a diode 1050 whose anode is connected to the outputs of the two multiplexers 1026 and 1028. The output of the NOR gate 1044 is also connected to the count input of a four bit counter 1052, and to one input of a two input NAND gate 1054, whose output is connected to the count input of a second four bit counter 1056.

The first, second and third outputs of the counter 1052 are connected to the first, second and third control inputs, respectively of the two multiplexers 1026 and 1028. The fourth output of the counter 1052 is connected to the input of an inverter 1058 whose output is connected to one input of a two input NAND gate 1060. The opposite input of the two input NAND gate 1060 is connected via a capacitor 1062 to the output of the inverter 1042 and via a resistor 1064 to ground. The output of the NAND gate 1060 is connected to the inhibit input of the multiplexer 1026. The fourth output of the counter 1052 is also connected to one input of a two input NAND gate 1066 whose second input is connected via the capacitor 1062 to the output of the inverter 1042, and whose output is connected to the inhibit input of the multiplexer 1028. The third and fourth inputs of the counter 1052 are also connected to two inputs, respectively, of a three input NAND gate 1068, whose third input is connected to the terminal 575 from the number of rows select circuit 143 of FIG. 7. Similarly, the fourth output of the counter 1052 is also connected with one input of a two input NAND gate 1070 whose opposite input is connected to the terminal 571 from the number of row select circuit 143 of FIG. 7. The outputs of the NAND gates 1068 and 1070 are connected to two inputs, respectively, of a four input NAND gate 1072.

The four outputs of the counter 1056 are connected to the terminals 704, 712, 714 and 716 to the row display decoder/driver circuit 118 of FIG. 9. The first three of the outputs of the counter 1056 are also connected to three inputs, respectively, of a four input NAND gate 1074, whose output is connected to a third input of the four input NAND gate 1072. The output of the NAND gate 1072 is connected via a capacitor 1076 to one input of a two input NOR gate 1078, which input is also connected via a resistor 1080 to ground. The opposite input of the NOR gate 1078 is connected to the line 734 of FIG. 8 and via a capacitor 1082 to ground. The output of the NOR gate 1078 is connected to one input of a two input NAND gate 1084, whose output is connected to the second input of the two input NOR gate 1054 at the input to the counter 1056. The output of the NAND gate 1072 is also connected to the reset inputs of the two counters 1052 and 1056 and, via a resistor 1086, to the second input of the NAND gate 1084 which is also connected to ground via capacitor 1087. The output of the NOR gate 1078 is also connected to the fourth input of the four input NAND gate 1072, and to one input of a two input NAND gate 1088, which is interconnected with a two input NAND gate 1090 to form a flip-flop. The opposite input of the two input NAND gate 1090 is connected via resistor 1090.2 to tv and via capacitor 1090.4 to the fourth output of the counter 1056, and the output thereof, which also forms an input to the NAND gate 1088, is connected to the fourth input of the four input NAND gate 1074, and to a terminal 1092 which is connected with a circuit to be described in FIG. 14. It will be appreciated that the foregoing circuits of FIG. 12 replace the circuits of FIG. 8, with the exception of the portion thereof enclosed by the dotted line indicated generally by the reference numeral 1212.

Figure 13:
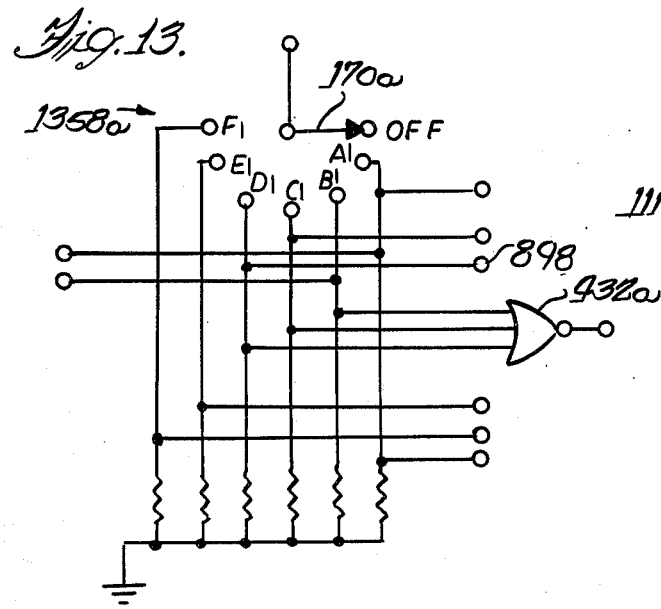

Referring now to FIG. 13, a second embodiment of the selector switch 58a of FIG. 5 is shown, indicated generally by the reference numeral 1358a. A contactor 170a thereof is connected to the resistor 172 and to the base electrode of the transistor 210 of FIG. 5. The switch 1358a is suitable for use with a planter of the type described above, which utilizes two independently rotated drums. Thus, the only substantial change from the switch 58a of FIG. 5, is in the addition of an extra terminal thereto to accomodate the second drum rotation sensor. In the embodiment of FIG. 13, the switch terminals A1, B1 and C1 all have identical connections as those described above for the switch terminals A, B, and C of the switch 58a of FIG. 5. It will be noted that the two input NOR gate 432 of FIG. 5 is replaced in the embodiment of FIG. 13 with a three input NOR gate 432a, whose three inputs are connected respectively to the switch terminals B1, C1 and D1. The D1 terminal provides for the selection of the second drum rotations sensor and is connected with the terminal 898 of FIG. 11A. Terminals E1 and F1 of the switch 1358a are the terminals for selecting the drum air pressure sensors associated with the two drums, and are provided with identical connections to the switch terminals D and E of the switch 58a of FIG. 5.

Figure 14:
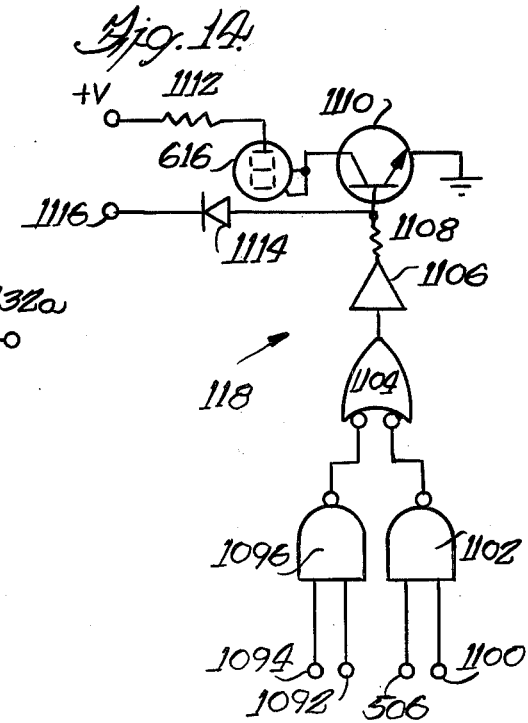

Referring now to FIG. 14, additional circuit elements are illustrated for adding a second digital display element to the display portion 61, for identifying one of up to 16 seed sensors. A pair of terminals 1092 and 1094 are connected to the inputs of a two input NAND gate 1096. The terminal 1092 is connected to the output of the NOR gate 1090 of FIG. 12, and the terminal 1094 is connected to the output of the inverter 762 at a control input of the select gate 738 of FIG. 9. Similarly, the terminal 506 of FIG. 9, connected to the second control input of the select gate 738 of FIG. 9, and a terminal 1100 from the output of the flip-flop comprising the NOR gates 984 and 986 from FIG. 11A (the output of the gate 984 thereof) form the two inputs of a two input NAND gate 1102. The outputs of the NAND gates 1096 and 1102 form the two inputs of a two input NAND gate 1104, whose output is connected via a buffer 1106 in series with a resistor 1108 to a base electrode of a transistor 1110. The emitter electrode of the transistor 1110 is connected to ground and the collector electrode thereof is connected to two inputs of a second digital display element 61b, which forms a most significant digit of the row display portion 61. The digital display element 61b is also connected via a suitable inductor 1112 to a positive voltage supply. The base electrode of the transistor 1110 is also connected to the anode of a diode 1114 whose cathode is connected to a terminal 1116 which is connected to the blanking input of the decoder/driver 746, at the output of the buffer 760 of FIG. 9.

It will be noted that the foregoing circuits of FIGS. 11 through 14 replace and/or supplement the circuits of FIGS. 5 through 10, as described, to provide a suitable monitoring circuit for accomodating a planter capable of planting up to 16 rows of seeds simultaneously, and having two independently driven rotating drums. Thus, the circuits illustrated in block diagrammatic form in FIG. 4 comprise the circuits of FIGS. 5 through 10, as modified and supplemented by the circuits of FIGS. 11 through 14, to perform the functions described therefor, and for the circuit of FIG. 3, for a monitoring planter, as described.

It will be noted in the foregoing circuit illustrations, that De Morgan equivalent circuits have been shown in portions thereof wherein such equivalent circuits are appropriate for providing the described logic.

While specific embodiments of the invention have been shown and described herein, it will be understood that the in-invention is not limited thereto. Various changes and modifications may occur to those skilled in the art, and are to be understood as forming a part of the invention insofar as they fall within the spirit and scope of the appended claims.

The invention is claimed as follows:

1. A planter monitor for a seed planting apparatus including hopper means for holding a supply of seeds, a plurality of conduit means for carrying seeds to be planted to corresponding planting rows, variable speed rotatable drum means for receiving seeds from said hopper means and delivering seed to said conduit means, variable pressure means for supplying pressurized air to said drum means to facilitate said seed delivery, said planter monitor comprising: seed sensor means connected with each of said conduit means for providing a seed signal in response to the passage of seeds therethrough, rotation sensor means connected with said drum means for providing a rotation signal in response to the rotational speed thereof, pressure sensor means connected with said drum means for providing a pressure signal corresponding to said air pressure supplied thereto and circuit means including readout selector means for selecting individual ones of said sensor means to receive the signals provided thereby, first readout circuit means connected with said readout selector means to provide readout signals corresponding to the values of the functions associated with the signals provided by the sensors selected, said monitor further including display means connected with said first readout circuit means for producing a display in accordance with said readout signal.

2. A planter monitor according to claim 1 wherein said readout selector means further includes means for simultaneously selecting one of said seed sensors and said rotation sensor and said first readout circuit means includes means for combining said seed and rotation signals therefrom to provide a readout signal corresponding to the number of seed passing through the conduit means associated with the selected seed sensor per revolution of said drum means.

3. A planter monitor according to claim 2 further including hopper level sensor means connected with said hopper for providing a low hopper level signal corresponding to the absence of seed at a predetermined level within said hopper, and said circuit means further including indicator circuit means connected with said hopper level sensor means for providing a low hopper level indication in response to said lower hopper level signal.

4. A planter monitor according to claim 3 wherein said indicator circuit means further includes means connected with said seed sensor means for producing a row failure indication in response to said seed signals provided thereby, said row failure indication corresponding to a failure of said conduit means associated with said seed sensor means to pass seeds therethrough at a predetermined rate.

5. A planter monitor according to claim 3 wherein said indicator circuit means further includes a voltage supply connected to a tractor battery or the like and means for monitoring said voltage supply and providing a low voltage indication when the value of the voltage supplied thereby is below a predetermined value.

6. A planter monitor according to claim 4 wherein said indicator circuit means further includes means connected with said rotation sensor means and responsive to said rotation signal for selectively disabling said row failure indication when the value of said rotation signal is below a predetermined value.

7. A planter monitor according to claim 4 wherein said indicator circuit means further includes means for selectively adjusting said predetermined rate to which said row failure indication corresponds.

8. A planter monitor according to claim 7 wherein said circuit means further includes first scanning circuit means connected with said first readout circuit means and with said readout selector means for selectively automatically or manually selecting individual ones of said seed sensor means in a predetermined order.

9. A planter monitor according to claim 8 wherein said indicator circuit means further includes second scanning circuit means for selecting said seed sensors in a predetermined sequence and second readout circuit means responsive to said second scanning circuit means, said row failure indication producing means and said seed sensor means for providing readout signals corresponding to the identity of the conduit means associated with individual ones of said row failure indications in said predetermined sequence.

10. A planter monitor according to claim 9, said circuit means further including means for selectively connecting said second readout circuit means with said first scanning circuit means for providing readout signals corresponding to the identity of the circuit means associated with the seed sensor means selected thereby.

11. A planter monitor according to claim 10, further including second display means responsive to said readout signals for providing a display corresponding thereto.

12. A monitor according to claim 11 wherein said row failure indication producing means includes means connected with said second readout circuit means for causing said second readout circuit means to provide said readout signals corresponding to the identity of the conduit means associated with said row failure indications in priority to said readout signals corresponding to the identity of the sensor means selected by said first scanning circuit means.

13. A planter monitor according to claim 11 wherein said indicator circuit means further includes means for providing said low hopper level indication in response to said low hopper level signal in priority to said providing of said row failure indication.

14. A planter monitor according to claim 13 wherein said second readout circuit means includes means connected to receive said low hopper level indication and provide a readout signal in response thereto for identifying said low hopper level indication.

15. A planter monitor according to claim 14 wherein said air pressure sensor means includes a pair of pressure sensors respectively connected with a corresponding pair of drums comprising said drum means in said planting apparatus for providing a pressure signal corresponding to the air pressure supplied to each of said drum means and said readout selector means includes means for individually selecting each of said pressure sensors.

16. A planter monitor according to claim 15 wherein said rotation sensor means includes two rotation sensors respectively connected with each of said drums for providing a rotation signal corresponding to the rotational speed of each drum, and said selector means further includes means for selecting each of said rotation sensors individually.

17. A planter monitor according to claim 14 wherein said indicator circuit means includes means for producing a different indication in response to said low hopper level signal, said row failure signals, and said low voltage signal, respectively, for identifying the function for which an indication is being given thereby.

18. A planter monitor according to claim 17 wherein said first readout circuit means includes means connected with said indicator circuit means and responsive to said indications therefrom for blanking said first readout means for the duration of said indications.

19. A planter monitior according to claim 18 wherein said row failure indication comprises a continuous indication for a predetermined period for each failure detected by said row failure indication producing means.

20. A planter monitor according to claim 19 wherein said hopper level indication comprises an intermittent indication.

21. A planter monitor according to claim 20 wherein said low voltage indication comprises a continuous indication for as long as said voltage supply value is below said predetermined value.

22. A planter monitor for a seed planter having conduit means for carrying seeds to be planted and variable speed rotatable drum means for delivering seeds to said conduit means, said monitor comprising: seed sensor means mounted on said conduit means for detecting said seeds and providing electrical signals corresponding thereto and rotation sensor means for detecting the rotation of said drum means and providing electrical signals corresponding thereto, circuit means including readout selector means for selecting individual ones of said seed sensor means or said rotation sensor means to monitor individually the functions associated therewith, readout circuit means connected to said readout selector means for receiving the electrical signals associated with the selected sensors and for providing a readout signal corresponding to the value of the function associated with the selected sensor in accordance with said electrical signals, said monitor further including display means connected to said readout circuit means for receiving said readout signal and producing a display in accordance therewith, and indicator circuit means connected to predetermined ones of said sensor means for receiving the electrical signals associated therewith and for providing an indication, simultaneously with said display, in response to a predetermined variation of the selected electrical signal from a predetermined value.

23. A planter monitor according to claim 22 wherein said indicator circuit means further include a voltage supply connected to a tractor battery or the like and means for monitoring said voltage supply and for providing an indication when the value of the voltage supplied thereby is below a predetermined value.

24. A planter monitor according to claim 21 wherein said first and second scanning circuit means include a number-of-row select means for selectively adjusting said circuit means to operate with a plurality of different numbers of seed sensors, corresponding to the number of rows planted simultaneously by the seed planter with which the planter monitor is associated.

25. A planter monitor for a seed planting apparatus including a plurality of conduit means for carrying seeds to be planted to corresponding planting rows and two independently driven variable speed rotatable drum means, each connected with predetermined ones of said conduit means for delivering seeds thereto, said planter monitor comprising: seed sensor means connected with each of said conduit means for providing a seed signal in response to the passage of each seed therethrough, rotation sensor means connected with each of said drum means for providing respective rotation signals in response to the rotational speeds thereof, and circuit means including readout selector means for selecting individual ones of said seed sensor means and said drum rotation sensor means to receive the signals provided thereby, said readout selector means including means for simultaneously selecting individual ones of said seed sensor means and said rotation sensor means, said circuit means further including readout circuit means connected with said readout selector means for counting said seed signals to provide a readout signal corresponding to the number of seeds passed through the conduit means associated with the selected seed sensor means and for combining said seed signal and said rotation signal to provide a readout signal corresponding to the number of seeds passing through the conduit means associated with the selected seed sensor per revolution of said drum and display means connected with said readout circuit means for producing a display in accordance with said readout signals.

26. A planter monitor according to claim 25 wherein said readout selector means further includes scanning circuit means for selecting individual ones of said seed sensor means in a predetermined order, and drum selector means for automatically selecting the drum connected with the conduit means associated with the selected seed sensor for providing said seeds per revolution signal.

27. A planter monitor according to claim 26 wherein said readout circuit means further includes means for counting the seeds delivered through the conduit means associated with the selected sensor, in accordance with the sensor signals therefrom, and averaging said seed count over four revolutions of the associated drum, for providing said seeds per revolution signal corresponding to said average seed count.

28. A planter monitor according to claim 27 wherein said counting and averaging means further includes means for resetting said display means in response to every four revolutions of said drum.

29. A planter monitor according to claim 28 wherein said scanning circuit means further includes means connected with said counting and averaging means for automatically selecting each of said sensor means in said predetermined order in response to each four revolutions of said drum, means for selecting said individual ones of said seed sensor means in said predetermined order in response to manual actuation thereof by an operator, and means for selecting between said automatic and said manual operation of said scanning circuit means.

30. A planter monitor for monitoring a plurality of functions associated with a seed planter wherein a voltage supply is provided connectable to said monitor, said monitor comprising: a plurality of sensor means each mounted on said planter for detecting one of said functions and providing electrical signals corresponding thereto, circuit means including readout selector means for selecting predetermined ones of said said sensor means to monitor the function associated therewith, readout circuit means connected to said readout selector means for receiving the electrical signals associated with the selected sensor means and providing readout signals corresponding to the value of the function associated therewith in accordance with said electrical signals, indicator circuit means connected to predetermined ones of said sensor means for receiving the electrical signals associated therewith and for providing an indication, simultaneously with said readout circuit means, in response to a predetermined variation of the selected electrical signals from a predetermined value, said indicator circuit means further including means for monitoring said voltage supply and for providing an indication when the value of the voltage supplied thereby is below a predetermined value.

31. A planter monitor according to claim 30 further including display means connected with said readout circuit means for receiving said readout signals and producing a display in accordance therewith.

32. A planter monitor according to claim 31 wherein said indicator circuit means further includes means connected with said readout circuit means for blanking said display means for the duration of said indications therefrom.

33. A planter monitor according to claim 32 wherein said readout selector means further includes means connected with said readout circuit means for resetting said display means in response to the selection of each of said sensor means by said readout selector means and by said scanning circuit means.

* * * * *

UNITED STATES PATENT AND TRADEMARK OFFICE
CERTIFICATE OF CORRECTION

PATENT NO. : 4,159,064
DATED : June 26, 1979
INVENTOR(S) : Charles F. Hood

It is certified that error appears in the above—identified patent and that said Letters Patent are hereby corrected as shown below:

Column 9, line 55, change "215" to --216--;

Column 21, line 57, change "around" to --ground--;
Column 21, line 64, change "622" to --662--;
Column 25, line 62, change "element" to --electrode--;
Column 34, line 5, change "lower" to --low--; and
Column 34, line 51, change "circuit" to --conduit--.

Signed and Sealed this

Nineteenth Day of February 1980

[SEAL]

Attest:

SIDNEY A. DIAMOND

Attesting Officer  Commissioner of Patents and Trademarks